United States Patent
Sakata et al.

(10) Patent No.: US 9,673,142 B2
(45) Date of Patent: Jun. 6, 2017

(54) SEMICONDUCTOR DEVICE

(71) Applicant: Renesas Electronics Corporation, Tokyo (JP)

(72) Inventors: Kazuyuki Sakata, Tokyo (JP); Takafumi Betsui, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/207,559

(22) Filed: Jul. 12, 2016

(65) Prior Publication Data

US 2017/0062322 A1 Mar. 2, 2017

(30) Foreign Application Priority Data

Aug. 28, 2015 (JP) ................. 2015-168596

(51) Int. Cl.
*H01L 23/48* (2006.01)
*H01L 23/498* (2006.01)
*H01L 23/00* (2006.01)

(52) U.S. Cl.
CPC .. *H01L 23/49838* (2013.01); *H01L 23/49816* (2013.01); *H01L 23/49827* (2013.01); *H01L 24/09* (2013.01); *H01L 24/11* (2013.01); *H01L 24/17* (2013.01); *H01L 24/27* (2013.01); *H01L 24/29* (2013.01); *H01L 2224/0401* (2013.01); *H01L 2224/13144* (2013.01); *H01L 2224/13147* (2013.01); *H01L 2924/1205* (2013.01)

(58) Field of Classification Search
CPC ......... H01L 23/49838; H01L 23/49816; H01L 24/11; H01L 24/09; H01L 24/17; H01L 24/29; H01L 24/27
USPC ....................................................... 257/773
See application file for complete search history.

(56) References Cited

U.S. PATENT DOCUMENTS

| 8,159,058 | B2 | 4/2012 | Ishikawa et al. | |
| 8,421,206 | B2 | 4/2013 | Akiyama et al. | |
| 2010/0019382 | A1* | 1/2010 | Miwa | H05K 1/112 257/737 |

FOREIGN PATENT DOCUMENTS

| JP | 2009-70965 A | 4/2009 |
| JP | 2010-129716 A | 6/2010 |

* cited by examiner

*Primary Examiner* — Anthony Ho
(74) *Attorney, Agent, or Firm* — Sughrue Mion, PLLC

(57) ABSTRACT

A semiconductor device with enhanced reliability. The semiconductor device has a wiring substrate which includes a first terminal electrically connected with a power supply potential supply section of a semiconductor chip, a first wiring coupling the power supply potential supply section with the first terminal, a second terminal electrically connected with a reference potential supply section of the semiconductor chip, and a second wiring coupling the reference potential supply section with the second terminal. The first terminal and second terminal are arranged closer to the periphery of the wiring substrate than the semiconductor chip. The second wiring is extended along the first wiring.

18 Claims, 15 Drawing Sheets

SEMICONDUCTOR DEVICE

CROSS-REFERENCE TO RELATED APPLICATIONS

The disclosure of Japanese Patent Application No. 2015-168596 filed on Aug. 28, 2015 including the specification, drawings and abstract is incorporated herein by reference in its entirety.

BACKGROUND

The present invention relates to semiconductor devices and more particularly to technology for a semiconductor device with a semiconductor chip mounted over a wiring substrate.

Japanese Unexamined Patent Application Publication No. 2009-70965 and Japanese Unexamined Patent Application Publication No. 2010-129716 each describe a semiconductor device including a package with a memory chip mounted over the package in which a microcomputer chip (or a semiconductor chip with a logic circuit) is mounted.

Japanese Unexamined Patent Application Publication No. 2009-70965 describes a configuration in which a testing pad for checking the conduction state between a microcomputer chip and a memory chip is arranged outside the lower surface of the wiring substrate of a lower package.

Japanese Unexamined Patent Application Publication No. 2010-129716 describes a configuration in which a bump for checking the connection between a lower semiconductor chip and an upper package and a bump for checking the connection with the upper package without the mediation of the lower semiconductor chip are arranged outside the lower surface of the wiring substrate of the lower package.

SUMMARY

As the performance of semiconductor devices is enhanced, there is a tendency that the power consumption of semiconductor devices increases. In order to stabilize the operation of a high-performance semiconductor device, a technique to control the power consumption of the circuit formed in the semiconductor chip of the semiconductor device and the impedance characteristics of the circuit is needed. Also, in order to control the power consumption or the impedance characteristics with high accuracy, a technique to measure the power consumption behavior and impedance characteristics of the circuit with high accuracy is needed.

The above and further objects and novel features of the invention will more fully appear from the following detailed description in this specification and the accompanying drawings.

According to one aspect of the present invention, there is provided a semiconductor device which has a semiconductor chip including a first circuit, a power supply potential supply section for supplying a power supply potential to the first circuit, and a reference potential supply section for supplying a reference potential to the first circuit. The semiconductor device also has a wiring substrate which includes a power supply potential terminal electrically connected with the power supply potential supply section of the semiconductor chip, a first wiring connecting the power supply potential supply section with the power supply potential terminal, a reference potential terminal electrically connected with the reference potential supply section of the semiconductor chip, and a second wiring connecting the reference potential supply section with the reference potential terminal. The power supply potential terminal and the reference potential terminal are arranged closer to the periphery of the wiring substrate than to the semiconductor chip and the second wiring is extended along the first wiring.

According to the invention, the reliability of the semiconductor device is enhanced.

DETAILED DESCRIPTION

Rules of Description in the Specification

The preferred embodiments of the present invention may be described separately in different sections as necessary or for convenience sake, but the embodiments described as such are not irrelevant to each other unless otherwise expressly stated. Regardless of the order in which they are described, one embodiment may be, in part, a detailed form of another, or one embodiment may be, in whole or in part, a variation of another. Basically, descriptions of the same elements or things are not repeated. In the preferred embodiments, when a specific numerical value is indicated for an element, the numerical value is not essential for the element unless otherwise expressly stated or unless theoretically limited to the numerical value or unless obviously the context requires the element to be limited to the specific value.

In description of a material or composition in an embodiment of the invention, the expression "X comprising A" does not exclude a material or composition which includes an element other than A unless otherwise expressly stated or unless obviously the context requires exclusion of another element. If the expression concerns a component, it means "X which contains A as a main component". For example, the term "silicon member" obviously refers to not only a member made of pure silicon but also a member made of SiGe (silicon germanium) alloy or another type of multi-component alloy which contains silicon as a main component or a member which contains another additive. Similarly, for example, the terms "gold plating," "Cu layer," and "nickel plating" refer to not only members made of pure gold, Cu and nickel but also members made of multi-component materials which contain gold, Cu and nickel as main components, respectively.

Also, even when a specific numerical value or quantity is indicated for an element, the numerical value or quantity of the element may be larger or smaller than the specific numerical value or quantity unless otherwise expressly stated or unless theoretically limited to the specific value or quantity or unless the context requires the element to be limited to the specific value or quantity.

In all the drawings that illustrate the preferred embodiments, the same or similar elements are designated by the same or similar reference signs or numerals and basically descriptions thereof are not repeated.

Regarding the accompanying drawings, hatching or the like may be omitted even in a cross section diagram if hatching may cause the diagram to look complicated or it is easy to distinguish the area concerned from an air gap. In connection with this, background contour lines may be omitted even for a planarly closed hole if the contour of the hole is apparent from an explanation, etc. Furthermore, even if a drawing does not show a cross section, hatching or a dot pattern may be added to clarify that the area concerned is not an air gap or to show the border of the area clearly.

<Outline of the Semiconductor Device>

Figure 1:
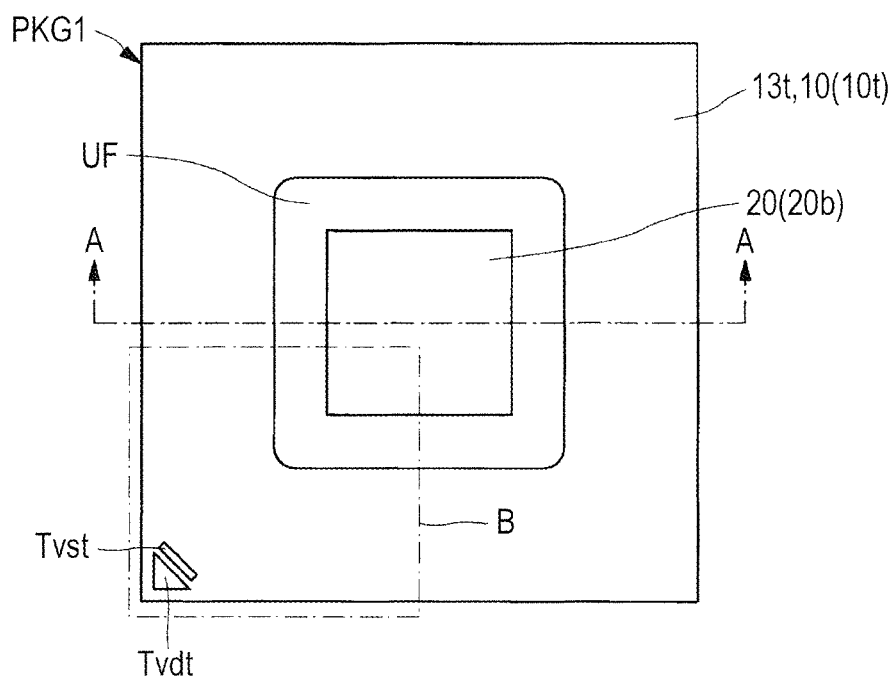
FIG. 1 is a top view of a semiconductor device according to an embodiment.
Figure 2:
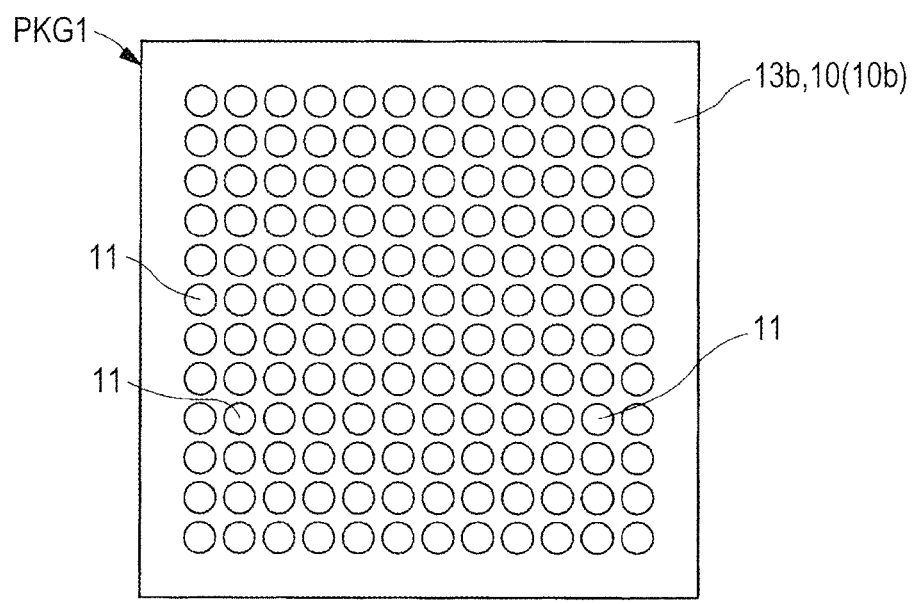
FIG. 2 is a bottom view of the semiconductor device shown in FIG. 1.
Figure 3:
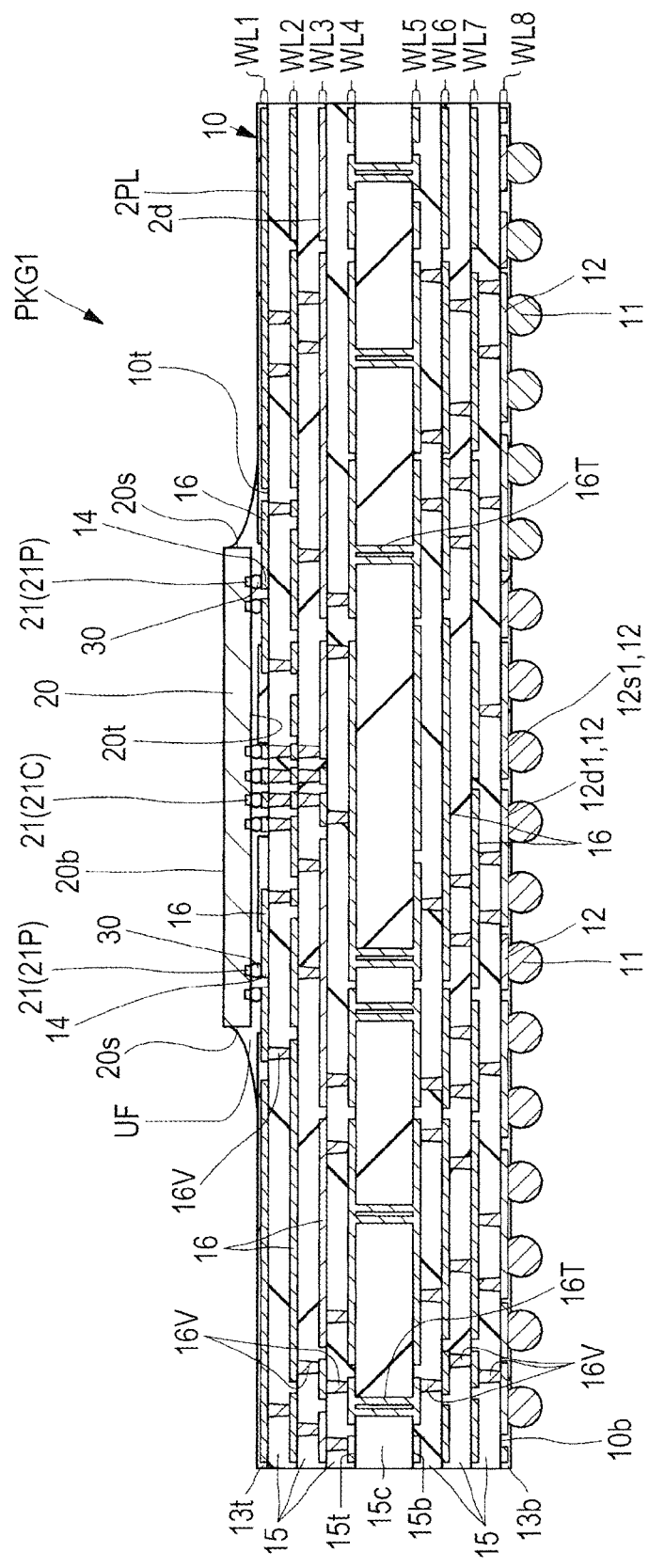
FIG. 3 is a sectional view taken along the line A-A of FIG. 1.
Figure 4:
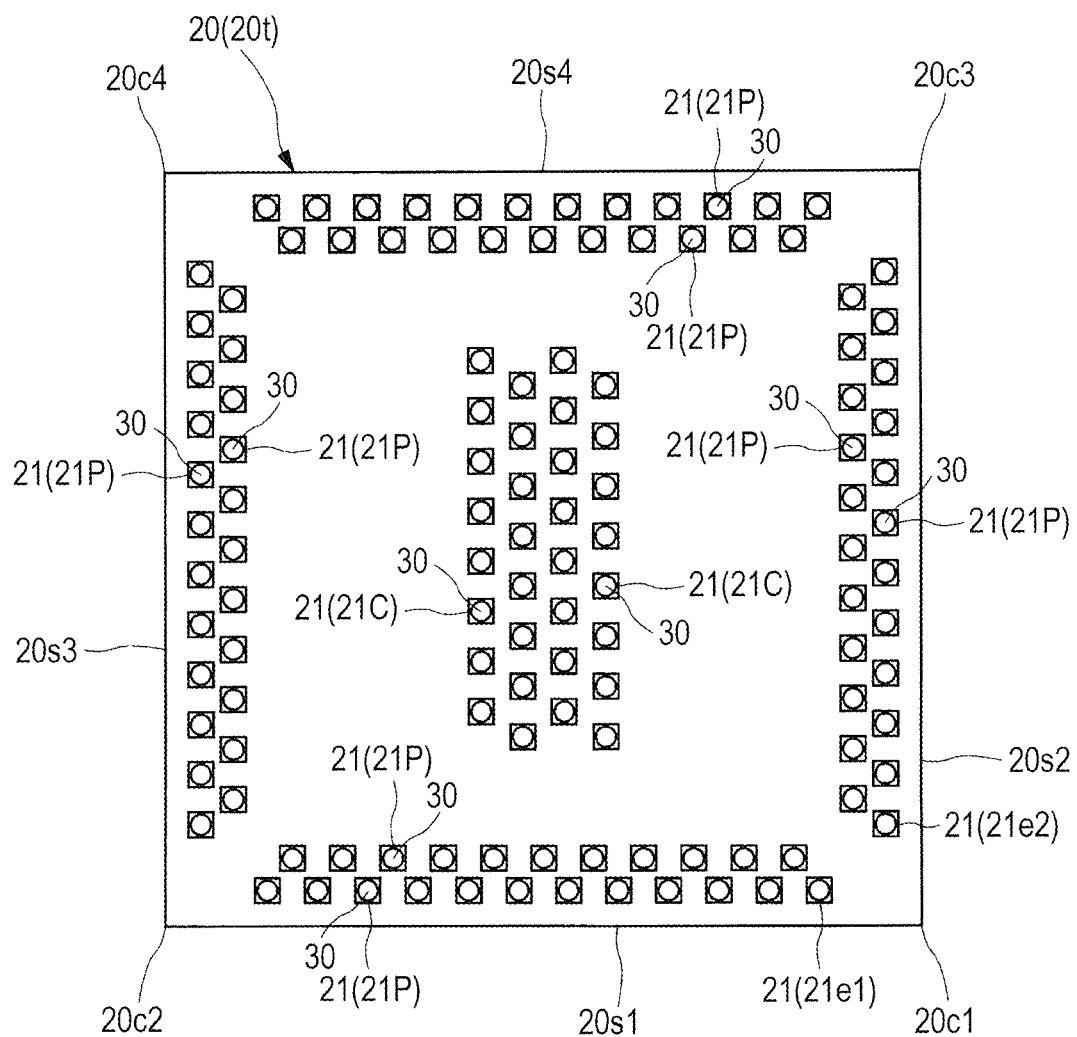
FIG. 4 is a plan view of the front surface (surface on which a plurality of electrodes are arranged) of the semiconductor chip shown in FIGS. 1 and 3.

First, the general configuration of a semiconductor device according to an embodiment of the invention will be described referring to FIGS. 1 to 3. FIG. 1 is a top view of the semiconductor device according to the embodiment, FIG. 2 is a bottom view of the semiconductor device shown in FIG. 1, and FIG. 3 is a sectional view taken along the line A-A of FIG. 1. FIG. 4 is a plan view of the front surface (surface on which a plurality of electrodes are arranged) of the semiconductor chip shown in FIGS. 1 and 3.

The semiconductor device PKG1 in this embodiment includes a wiring substrate (package substrate) 10, a semiconductor chip 20 mounted over the wiring substrate 10 (see FIGS. 1 and 3), a plurality of bump electrodes (conductive members) 30 electrically connecting the semiconductor chip 20 with the wiring substrate 10 (see FIG. 3), and underfill resin (sealing part, resin body, sealing resin) UF for sealing the joints (bump electrodes 30) between the semiconductor chip 20 and the wiring substrate 10.

The wiring substrate 10 of the semiconductor device PKG1 is a substrate having a transmission path to transmit an electric signal or potential between the semiconductor device PKG1 and the mounting board (not shown). As shown in FIG. 3, the wiring substrate 10 has an upper surface 10t on a chip mounting surface side where the semiconductor chip 20 is mounted and a lower surface 10b opposite to the upper surface 10t.

As shown in FIG. 3, the wiring substrate 10 has a plurality of wiring layers, in which the uppermost wiring layer WL1 (nearest to the semiconductor chip 20) is covered by an insulating film 13t and the lowermost wiring layer WL8 (remotest from the semiconductor chip 20) is covered by an insulating film 13b, which will be described in detail later. In the present invention, the upper surface of the wiring layer WL1 shown in FIG. 3 is defined as the upper surface 10t of the wiring substrate 10. Similarly, the lower surface of the wiring layer WL8 shown in FIG. 3 is defined as the lower surface 10b of the wiring substrate 10.

In the present invention, the "chip mounting surface" means the surface of the wiring substrate 10 which is nearest to the semiconductor chip 20 (for example, the upper surface of the insulating film 13t shown in FIG. 3). However, as shown in FIG. 3, the chip mounting surface has a plurality of openings in the insulating film 13t and the upper surface 10t may be partially exposed in the openings. Therefore, the upper surface 10t may be described as the chip mounting surface in the present invention.

Similarly, in the present invention, the "mounting surface" means the surface of the wiring substrate 10 which is opposite to the chip mounting surface (for example, the lower surface of the insulating film 13b shown in FIG. 3). However, the mounting surface has a plurality of openings in the insulating film 13b and the lower surface 10b may be partially exposed in the openings (in the example shown in FIG. 3, the lower surface 10b is not exposed). Therefore, the lower surface 10b may be described as the mounting surface in the present invention.

As shown in FIG. 2, the semiconductor device PKG1 has a plurality of solder balls (external terminals, electrodes, external electrodes) 11 arranged on the lower surface 10b of the wiring substrate 10. The solder balls 11 are arranged in rows and columns (array or matrix pattern).

More specifically, as shown in FIG. 3, each of the solder balls 11 is connected with one of lands (external terminals) 12 formed on the lower surface 10b of the wiring substrate 10. The lower surface 10b of the wiring substrate 10 is covered by the insulating film (solder resist film) 13b. A plurality of openings are made in the insulating film 13b and in each of the openings, the land 12 is at least partially exposed from the insulating film 13b. A solder ball 11 is connected with the portion of the land 12 which is exposed from the insulating film 13b.

A semiconductor device in which a plurality of external terminals (solder balls 11, lands 12) are arranged in a matrix pattern on its mounting surface, like the semiconductor package PKG1, is called an area array semiconductor device. Since in the area array semiconductor device PKG1 the mounting surface (lower surface 10b) of the wiring substrate 10 can be effectively used as space for arrangement of external terminals, the area array semiconductor device PKG1 is desirable from the viewpoint of suppressing the increase in the mounting area which is required to cope with an increase in the number of external terminals. In short, in the semiconductor device PKG1 with enhanced performance, an increasing number of external terminals can be mounted in a smaller space.

As a variation of the example shown in FIG. 3, the lands 12 may function as external terminals. In this case, the lands 12 are not connected with the solder balls 11 and each of the lands 12 is exposed from the insulating film 13t on the lower surface 10b of the wiring substrate 10. As another variation of the example shown in FIG. 3, a thin solder film may be formed instead of a ball-shaped solder ball 11 and the solder film may function as an external terminal.

As shown in FIG. 3, the wiring substrate 10 has a plurality of bonding fingers (terminals, chip connecting terminals, bonding leads) 14 formed on the upper surface 10t of the wiring substrate 10. Each of the bonding fingers 14 is an internal interface terminal in the semiconductor device PKG1 which is electrically connected with the circuit of the semiconductor chip 20 (which will be described in detail later). In the example shown in FIG. 3, the bonding fingers 14 are arranged so as to overlap the semiconductor chip 20 in the thickness direction and electrically connected with a plurality of pads (electrodes, electrode pads) 21 of the semiconductor chip 20 through a plurality of bump electrodes 30.

The upper surface 10t of the wiring substrate 10 is covered by the insulating film (solder resist film) 13t. The insulating film 13t has an opening in which a bonding finger 14 is at least partially exposed from the insulating film 13t. One end of a bump electrode 30 is connected with the portion of the bonding finger 14 which is exposed from the insulating film 13t.

As shown in FIG. 3, the wiring substrate 10 has a plurality of wiring layers WL1, WL2, WL3, WL4, WL5, WL6, WL7, and WL8 (eight layers in the example shown in FIG. 3) which electrically connect the bonding fingers 14 on the upper surface 10t with the lands 12 on the lower surface 10b. Each of the wiring layers has a conductive pattern such as a wiring 16 and neighboring conductive patterns are covered by insulating layers 15. The number of wiring layers in the wiring substrate 10 is not limited to eight as shown in FIG. 3, but for example, it may be smaller or larger than eight.

In the example shown in FIG. 3, the wiring substrate 10 has a core layer (core material, core insulating layer, insulating layer) 15c as a base material, in which a plurality of wiring layers are stacked on each of the upper surface 15t and lower surface 15b of the core layer 15c. The core layer 15c is an insulating layer as the base material of the wiring substrate 10, which is made of an insulating material, for example, a fiber material, such as glass fiber, impregnated with a resin material such as epoxy resin. The insulating layers 15 stacked on the upper surface and lower surface of the core layer 15c are, for example, made of an organic insulating material such as thermosetting resin. The wiring layers and insulating layers 15 stacked on the upper surface 15t and lower surface 15b of the core layer 15c are formed, for example, by a build-up method. As a variation of the example shown in FIG. 3, the wiring substrate 10 may be a so-called coreless substrate which does not have a core layer 15c.

The wiring substrate 10 has via wirings 16V located between wiring layers to connect neighboring wiring layers electrically in the thickness direction. Since the core layer 15c shown in FIG. 3 is thicker than the other insulating layers, it is difficult to form via wirings 16V. Therefore, the core layer 15c has a plurality of through hole wirings 16T which penetrate the core layer 15c between the upper surface 15t and lower surface 15b. Among the wiring layers WL1, WL2, WL3, WL4, WL5, WL6, WL7, and WL8, neighboring wiring layers in the thickness direction are electrically connected with each other through the via wirings 16V or through hole wirings 16T. In other words, the bonding fingers 14 and lands 12 of the wiring substrate 10 are electrically connected through the wiring layers WL1, WL2, WL3, WL4, WL5, WL6, WL7, and WL8, via wirings 16V, and through hole wirings 16T. The conductive members which electrically connect neighboring wiring layers in the thickness direction, like the via wirings 16V and through hole wirings 16T, are called interlayer conduction paths.

Among the wiring layers of the wiring substrate 10, a wiring 16 in the uppermost wiring layer (wiring layer WL1 nearest to the upper surface 10t) is integrated with a bonding finger 14. In other words, the bonding finger 14 may be considered as part of the wiring 16. In order to distinguish between the bonding finger 14 and the wiring 16, the exposed portion from the insulating film 13t on the upper surface 10t of the wiring substrate 10 may be defined as the bonding finger 14 and the portion covered by the insulating film 13t may be defined as the wiring 16. On the other hand, among the wiring layers of the wiring substrate 10, a wiring 16 in the lowermost wiring layer (wiring layer WL8 nearest to the lower surface 10b) is integrated with a land 12. In other words, the land 12 may be considered as part of the wiring 16. In order to distinguish between the land 12 and the wiring 16, the exposed portion from the insulating film 13b on the lower surface 10b of the wiring substrate 10 may be defined as the land 12 and the portion covered by the insulating film 13b may be defined as the wiring 16.

As shown in FIGS. 1 and 3, the semiconductor chip 20 lies over the upper surface 10t of the wiring substrate 10. The semiconductor chip 20 has a front surface (main surface, upper surface) 20t (see FIG. 3), a back surface 20b (main surface, lower surface) opposite to the front surface 20t, and side surfaces 20s (see FIG. 3) located between the front surface 20t and the back surface 20b. The semiconductor chip 20 has a square shape in plan view as shown in FIG. 4.

Specifically, the front surface 20t of the semiconductor chip 20 (and the back surface 20b shown in FIG. 3) has a side 20s1, a side 20s2 intersecting with the side 20s1, a side 20s3 intersecting with the side 20s1 and opposite to the side 20s2, and a side 20s4 opposite to the side 20s1 and intersecting with the sides 20s2 and 20s3. The front surface 20t (and the back surface 20b shown in FIG. 3) of the semiconductor chip 20 has a corner 20c1 as an intersection between the sides 20s1 and 20s2, a corner 20c2 as an intersection between the sides 20s1 and 20s3, a corner 20c3 as an intersection between the sides 20s2 and 20s4, and a corner 20c4 as an intersection between the sides 20s3 and 20s4.

As shown in FIG. 4, the semiconductor chip 20 has a plurality of pads (electrodes, chip electrodes, electrode pads) 21 arranged on the front surface 20t. The pads 21 are external terminals of the semiconductor chip 20 and exposed from the insulating film which covers the surface 20t of the semiconductor chip 20.

In the example shown in FIG. 4, the pads 21 include a plurality of peripheral electrodes 21P arranged along the sides of the front surface 20t of the semiconductor chip 20 (arranged on the peripheral side of the front surface 20t) and a plurality of center electrodes (core electrodes) 21C arranged more inward than the peripheral electrodes 21P. In the example shown in FIG. 4, the peripheral electrodes 21P are arranged in a plurality of rows (two rows in the example shown in FIG. 4) along the sides 20s1, 20s2, 20s3, and 20s4 of the semiconductor chip 20. In this embodiment, the peripheral electrodes 21P are mainly used to transmit signals or a power supply potential or reference potential, which will be detailed later. On the other hand, the center electrodes 21 are used to supply a power supply potential or reference potential to drive core circuits such as arithmetic processing circuits which will be described later.

Though not shown, a plurality of semiconductor elements (circuit elements) such as a diode and a transistor are formed in the semiconductor element formation surface of the semiconductor chip 20 and they are electrically connected with the pads 21 through wirings (wiring layers, not shown) formed over the semiconductor elements. Thus, in the semiconductor chip 20, the semiconductor elements formed on the main surface and the wirings electrically connecting the semiconductor elements configure an integrated circuit.

The substrate (semiconductor substrate) of the semiconductor chip 20 which has the semiconductor element formation surface is, for example, made of silicon (Si). The pads 21 are made of metal and in this embodiment, they are made of aluminum (Al).

In the example shown in FIG. 3, the semiconductor chip 20 is mounted over the upper surface 10t of the wiring substrate 10 with its front surface 20t facing to the upper surface 10t of the wiring substrate 10. This mounting method is called the face-down mounting method.

As shown in FIG. 3, the semiconductor chip 20 is electrically connected with the wiring substrate 10 through the bump electrodes 30. Specifically, one end of each bump electrode 30 is connected with an exposed pad 21 on the front surface 20t of the semiconductor chip 20. The other end of the bump electrode 30 is connected with a bonding finger 14 on the wiring substrate 10. For example, the bump electrode 30 is a protruding electrode of gold (Au) or copper (Cu) in which one end is joined to a pad 21 and a bonding material such as solder is joined to the tip of the protruding electrode. Alternatively, a solder material shaped into a ball may be used as a bump electrode 30. The method in which the pads 21 of the semiconductor chip 20 and the bonding fingers 14 are electrically connected through the bump electrodes 30 is called the flip-chip connection method.

As shown in FIG. 3, the underfill resin (insulating resin) UF lies between the semiconductor chip 20 and the wiring substrate 10. The underfill resin UF is arranged so as to cover the space between the front surface 20t of the semiconductor chip 20 and the upper surface 10t of the wiring substrate 10. The underfill resin UF is made of an insulating (nonconductive) material (for example, resin material) and arranged so as to seal the electrical connections (joints of the bump electrodes 30) between the semiconductor chip 20 and the wiring substrate 10. Since the areas around the bump electrodes 30 are covered by the underfill resin UF, the stress generated at the electrical connections between the semiconductor chip 20 and the wiring substrate 10 is reduced. The stress generated at the joints between the pads 21 of the semiconductor chip 20 and the bump electrodes 30 is also reduced. The underfill resin UF also protects the surface of the semiconductor chip 20 where the semiconductor elements (circuit elements) are formed.

<Example of the Circuit Configuration>

Figure 5:
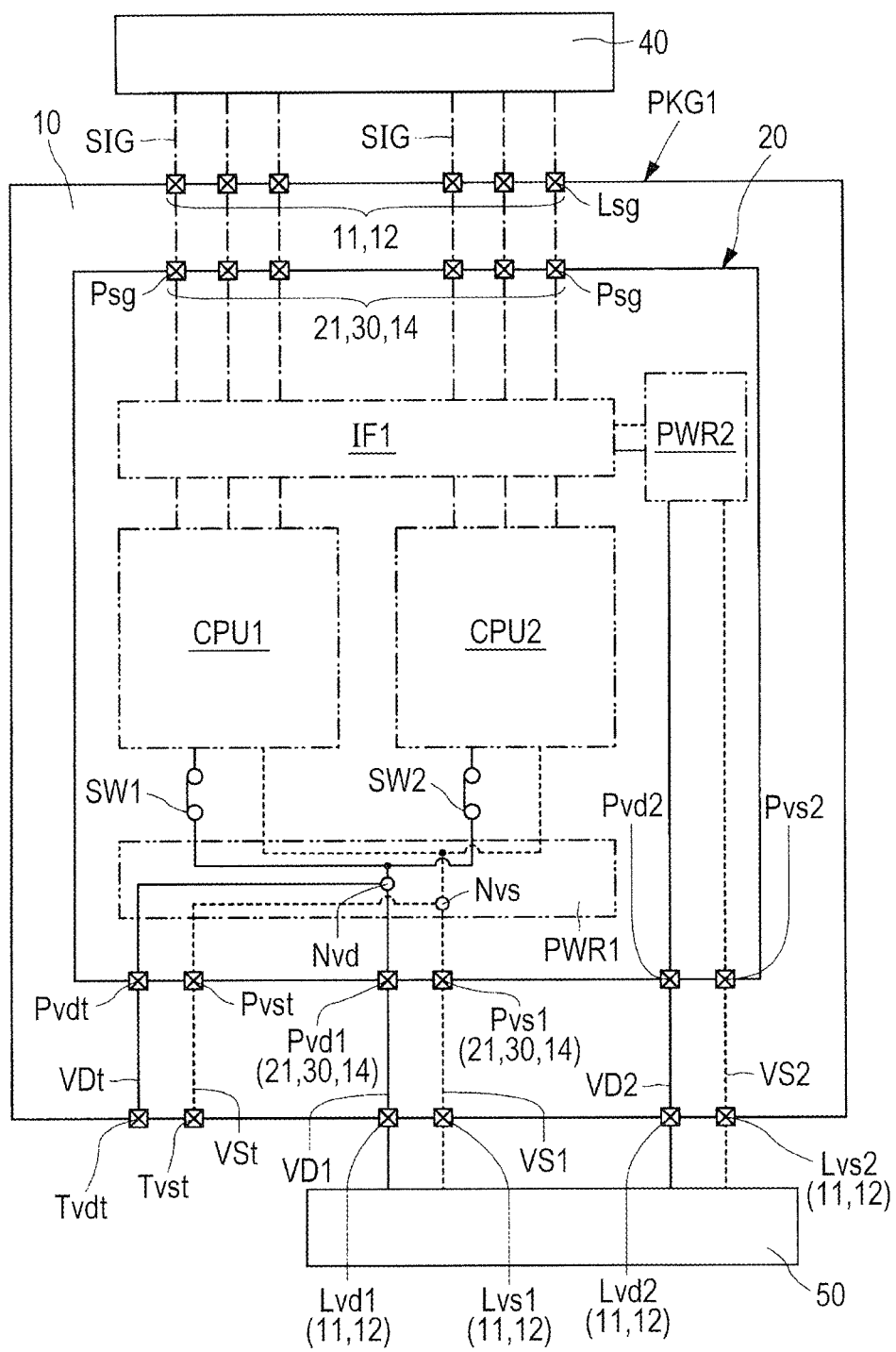
FIG. 5 is a block diagram showing an example of the circuit configuration of the semiconductor device shown in FIGS. 1 to 3.

Next, the example of the circuit configuration of the semiconductor device shown in FIGS. 1 to 3 will be described. FIG. 5 is a block diagram showing the example of the circuit configuration of the semiconductor device shown in FIGS. 1 to 3.

In FIG. 5, for discrimination among the wiring paths for transmitting signals, the wiring paths for supplying a power supply potential, and the wiring paths for supplying a reference potential, these paths are indicated by different types of lines. The chain lines indicate the wiring paths for transmitting signals (signal lines SIG). The solid lines indicate the wiring paths for supplying a power supply potential (power supply lines VD1 and VD2). The dotted lines indicate the wiring paths for supplying a reference potential (reference potential lines VS1, VS2). The various circuits of the semiconductor chip 20 are indicated by the chain double-dashed lines.

In FIG. 5, Psg, Pvd1, Pvs1, Pvd2, Pvs2, Pvdt, and Pvst represent the joints of the pads 21, bump electrodes 30, and bonding fingers 14 shown in FIG. 3. Also, in FIG. 5, Lsg, Lvd1, Lvs1, Lvd2, and Lvs2 represent the joints of the lands 12 and solder balls 11 shown in FIG. 3.

The semiconductor device PKG1 shown in FIG. 5 has a system which runs when a signal is transmitted between the semiconductor chip 20 and an external apparatus 40. For example, the external apparatus 40 is a memory package including a main storage circuit (storage circuit, memory circuit) which stores data communicated with the semiconductor chip 20. The external apparatus 40 transmits signals to the semiconductor chip 20 or receives signals from the semiconductor chip 20 and writes data in the main storage circuit or reads data from the main storage circuit.

The arithmetic processing circuits CPU1 and CPU2 of the semiconductor chip 20 function, for example, as control circuits which control the operation (writing or reading operation) of the main storage circuit of the external apparatus 40. The arithmetic processing circuits CPU1 and CPU2 also function as data processing circuits which perform, for example, arithmetic operations such as numerical calculations for data signals received from the external apparatus 40. A circuit which performs apparatus control or data processing like the arithmetic processing circuits CPU1 and CPU2 is structurally more complicated and consumes more power than an input/output circuit which deals with input and output of signals (for example, an interface circuit IF1). The influence of the arithmetic processing circuits CPU1 and CPU2 on the performance of the semiconductor chip 20 is larger than the input/output circuit. Main circuits such as the arithmetic processing circuits CPU1 and CPU2 are called core circuits.

The semiconductor chip 20 has an interface circuit (input/output circuit, external input/output circuit) IF1 which receives signals from, or transmits signals to, the external apparatus 40. The interface circuit IF1 is connected with signal lines SIG to transmit signals between the semiconductor chip 20 and the external apparatus 40. The interface circuit IF1 is also connected with the arithmetic processing circuits CPU1 and CPU2. The interface circuit IF1 has a function to send a data signal received from the external apparatus 40 to the arithmetic processing circuits CPU1 and CPU2 (output function, relay function). The interface circuit IF1 also has a function to send a control signal or a processed data signal from the arithmetic processing circuits CPU1 and CPU2 to the external apparatus 40 (output function, relay function).

The semiconductor chip 20 has a power supply circuit PWR1 which is supplied with power to drive the arithmetic processing circuits CPU1 and CPU2. In the example shown in FIG. 5, the power supply circuit PWR1 is connected with a power supply line (power supply potential wiring path) VD1 for supplying a power supply potential and a reference potential line (reference potential wiring path) VS1 for supplying a reference potential. The potential to drive the arithmetic processing circuits CPU1 and CPU2 is supplied from a power source (regulator) 50 located outside the semiconductor device PKG1 to the arithmetic processing circuits CPU1 and CPU2 through the power supply circuit PWR1.

Thus, the power supply circuit PWR1 is a circuit which relays the drive voltage supplied externally. For example, if the power supply circuit PWR1 has a function to change the voltage level, the power supplied from the power source 50 can be transformed in the power supply circuit PWR1 and supplied to the arithmetic processing circuits CPU1 and CPU2. For example, if the power supply circuit PWR1 has a function (protection function) to stop a current if the current exceeds a preset value, it prevents an overcurrent from flowing in the arithmetic processing circuits CPU1 and CPU2.

The semiconductor chip 20 has a power supply circuit PWR2 which is supplied with power to drive the interface circuit IF1. In the example shown in FIG. 5, the power supply circuit PWR2 is connected with a power supply line VD2 for supplying a power supply potential and a reference potential line VS2 for supplying a reference potential. The potential to drive the interface circuit IF1 is supplied from the power source (regulator) 50 located outside the semiconductor device PKG1 to the interface circuit IF1 through the power supply circuit PWR2.

In the example shown in FIG. 5, the power supply circuit PWR1 to be supplied with power to drive the arithmetic processing circuits CPU1 and CPU2 is separated from the power supply circuit PWR2 to be supplied with power to drive the interface circuit IF1. However, the circuit which supplies power to the interface circuit IF1 may be configured in other various ways. For example, the power whose voltage is transformed by the power supply circuit PWR1 may be supplied to the power supply circuit PWR2 or interface circuit IF1, in which the power supply line VD2 and reference potential line VS2 shown in FIG. 5 are not provided. In that case, the power supply path of the wiring substrate 10 can be structurally simplified.

The potential supplied to the reference potential line VS1 and reference potential line VS2 is, for example, a grounding potential. However, since the drive voltage is determined by the difference between a first potential and a second potential which are different from each other, the potential supplied to the reference potential line VS1 and reference potential line VS2 may be a potential other than the grounding potential.

Among the wiring paths shown in FIG. 5, it is desirable that the wiring path distance for the signal lines SIG be short. When the signal transmission path distance is shortened, the reliability in signal transmission is enhanced. By using the outermost pads 21 among the pads 21 shown in FIG. 4, the wiring path distance for the signal lines SIG shown in FIG. 5 can be shortened easily. Since a wiring connected with an outermost pad 21 can easily avoid contact with another wiring, it can contribute to decreasing the distance to bypass the other wiring (wiring distance).

Therefore, among the pads 21 shown in FIG. 4, the peripheral electrodes 21P arranged along the periphery of the front surface 20t are connected with the joints Psg as portions of the signal lines SIG.

As mentioned above, transmission of signals between the arithmetic processing circuits CPU1 and CPU2 and the external apparatus 40 is performed through the interface circuit IF1. For the purpose of shortening the signal transmission distance, it is desirable that the interface circuit IF1 be located on the front surface 20t shown in FIG. 4, closer to the peripheral electrodes 21P than to the center electrodes 21C. When the interface circuit IF1 is located near to the peripheral electrodes 21P, it is also desirable that the power supply line VD2 for supplying power to drive the interface circuit IF1 and the reference potential line VS2 be connected with the peripheral electrodes 21P. This is because when the path to supply power is closer to a circuit which consumes power, power loss is smaller.

Therefore, among the pads 21 shown in FIG. 4, the peripheral electrodes 21P arranged along the periphery of the front surface 20t are connected with the joint Pvd2 as a portion of the power supply line VD2 and the joint Pvs2 as a portion of the reference potential line VS2.

Therefore, the arithmetic processing circuits CPU1 and CPU2 and the power supply circuit PWR1 to be supplied with power to drive the arithmetic processing circuits CPU1 and CPU2 are located near to the center electrodes 21C shown in FIG. 4. Among the pads 21 shown in FIG. 4, the center electrodes 21C located on the inside of the peripheral electrodes 21P are connected with the joint Pvd1 as a portion of the power supply line VD1 and the joint Pvs1 as a portion of the reference potential line VS1.

FIG. 5 shows an example of the circuit of the semiconductor chip 20 which includes arithmetic processing circuits CPU1 and CPU2, an interface circuit IF1, and power supply circuits PWR1 and PWR2. The type and number of circuits of the semiconductor chip 20 are not limited to what is shown in FIG. 5 and may be modified in various ways. For example, the semiconductor chip 20 may include an auxiliary storage circuit (memory circuit) which has a smaller memory capacity than the main storage circuit of the external apparatus 40, such as a cache memory which temporarily stores data.

As a variation of this embodiment, the external apparatus 40 shown in FIG. 5 may be mounted on the wiring substrate 10 and connected with the semiconductor chip 20 in the package of the semiconductor device PKG1. This embodiment is explained on the assumption that the external apparatus 40 is connected outside the semiconductor device PKG1 since the explanation mainly focuses on the method for supplying power to the core circuits (arithmetic processing circuits CPU1 and CPU2) of the semiconductor chip 20.

In the example shown in FIG. 5, the semiconductor chip 20 has a plurality of arithmetic processing circuits which operate independently of each other. Specifically the semiconductor chip 20 has arithmetic processing circuits CPU1 and CPU2.

Here, "operate independently" means that the arithmetic processing circuits can perform different processing tasks or mutually related processing tasks concurrently. For example, in the example shown in FIG. 5, the arithmetic processing circuit CPU1 performs a first processing task and the arithmetic processing circuit CPU2 performs a processing task which is different from the first processing task or related to the first processing task so as to increase the overall processing speed of the semiconductor chip 20. In this case, the arithmetic processing circuits CPU1 and CPU2 operate independently of each other. If the load of the required processing task is small, there may be a case that the arithmetic processing circuit CPU1 performs a processing task and the arithmetic processing circuit CPU2 stops performing the processing task to reduce power consumption. In this case as well, the arithmetic processing circuits CPU1 and CPU2 operate independently of each other.

Figure 7:
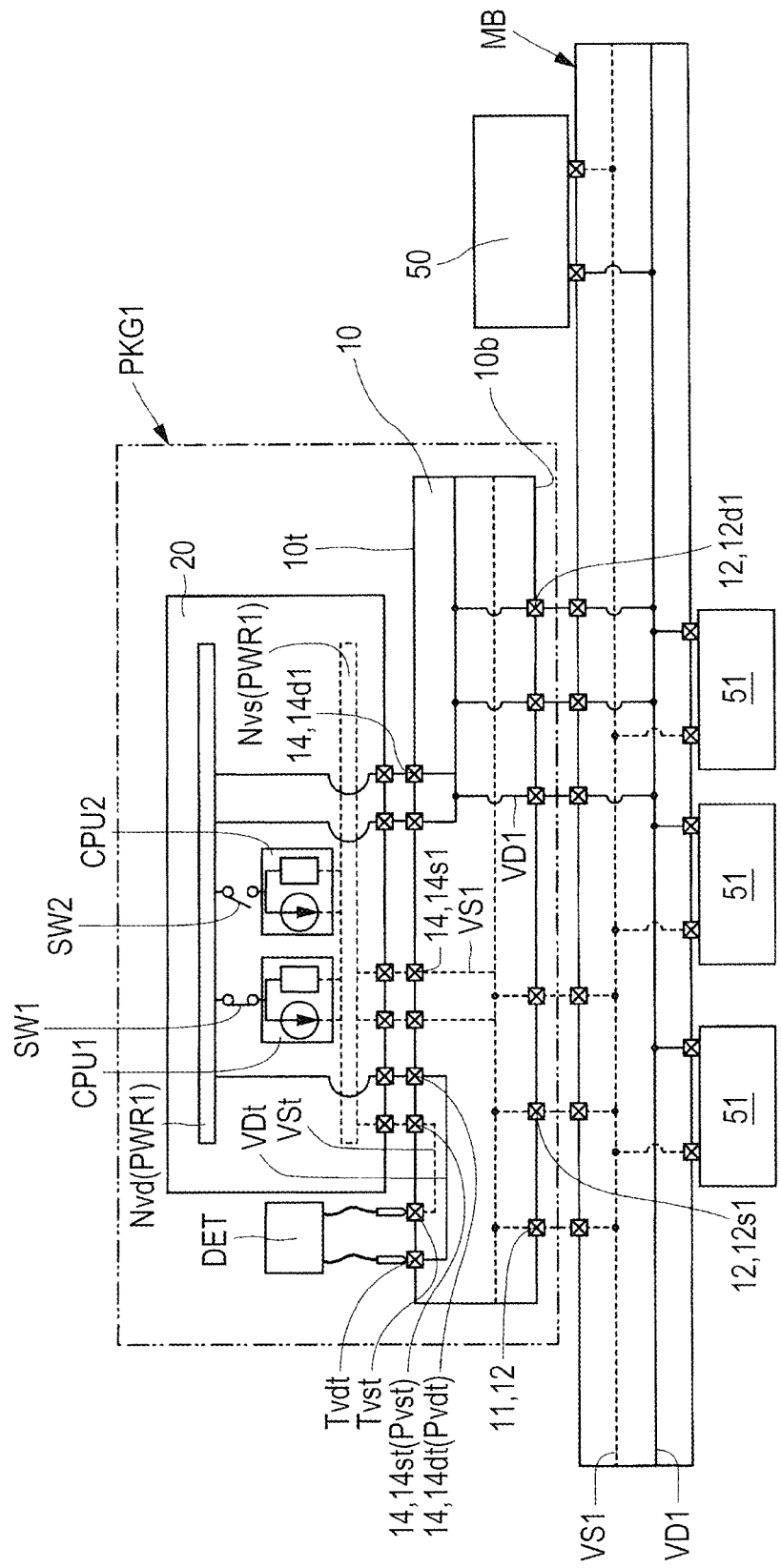
FIG. 7 schematically illustrates the relation between the power supply path to the core circuits of the semiconductor chip and the power measuring path of the core circuits, with the semiconductor device shown in FIGS. 1 to 3 mounted over the mounting board.

In the examples shown in FIGS. 5 and 7, in order to ensure that the arithmetic processing circuits CPU1 and CPU2 operate independently of each other, the arithmetic processing circuit CPU1 is connected with a power supply potential supply section Nvd of the power supply circuit PWR1 through a switch SW1. The arithmetic processing circuit CPU2 is connected with the power supply potential supply section Nvd of the power supply circuit PWR1 through a switch SW2. Alternatively, the arithmetic processing circuits CPU1 and CPU2 may be connected not with the power supply potential supply section Nvd of the power supply circuit PWR1 but with a reference potential supply section Nvs of the power supply circuit PWR1 through the switches SW1 and SW2, respectively.

The power supply potential supply section Nvd shown in FIG. 5 is a node which receives the power supply potential to be supplied to the arithmetic processing circuits CPU1 and CPU2. The power supply line VD1 to supply the power supply potential from the power source 50 supplies the power supply potential to the power supply potential supply section Nvd as a node. The arithmetic processing circuits CPU1 and CPU2 are supplied with the power supply potential from the power supply potential supply section Nvd as a node. A terminal Tvdt to measure the change in the power consumption of the arithmetic processing circuits CPU1 and CPU2 is connected with the power supply potential supply section Nvd as a node, which will be described later.

Similarly, the reference potential supply section Nvs is a node which receives the reference potential to be supplied to the arithmetic processing circuits CPU1 and CPU2. The reference potential line VS1 to supply the reference potential from the power source 50 supplies the reference potential to the reference potential supply section Nvs as a node. The arithmetic processing circuits CPU1 and CPU2 are supplied with the reference potential from the reference potential supply section Nvs as a node. A terminal Tvst to measure the change in the power consumption of the arithmetic processing circuits CPU1 and CPU2 is connected with the reference potential supply section Nvs as a node, which will be described later.

<Details of the Power Supply Paths>

Figure 6:
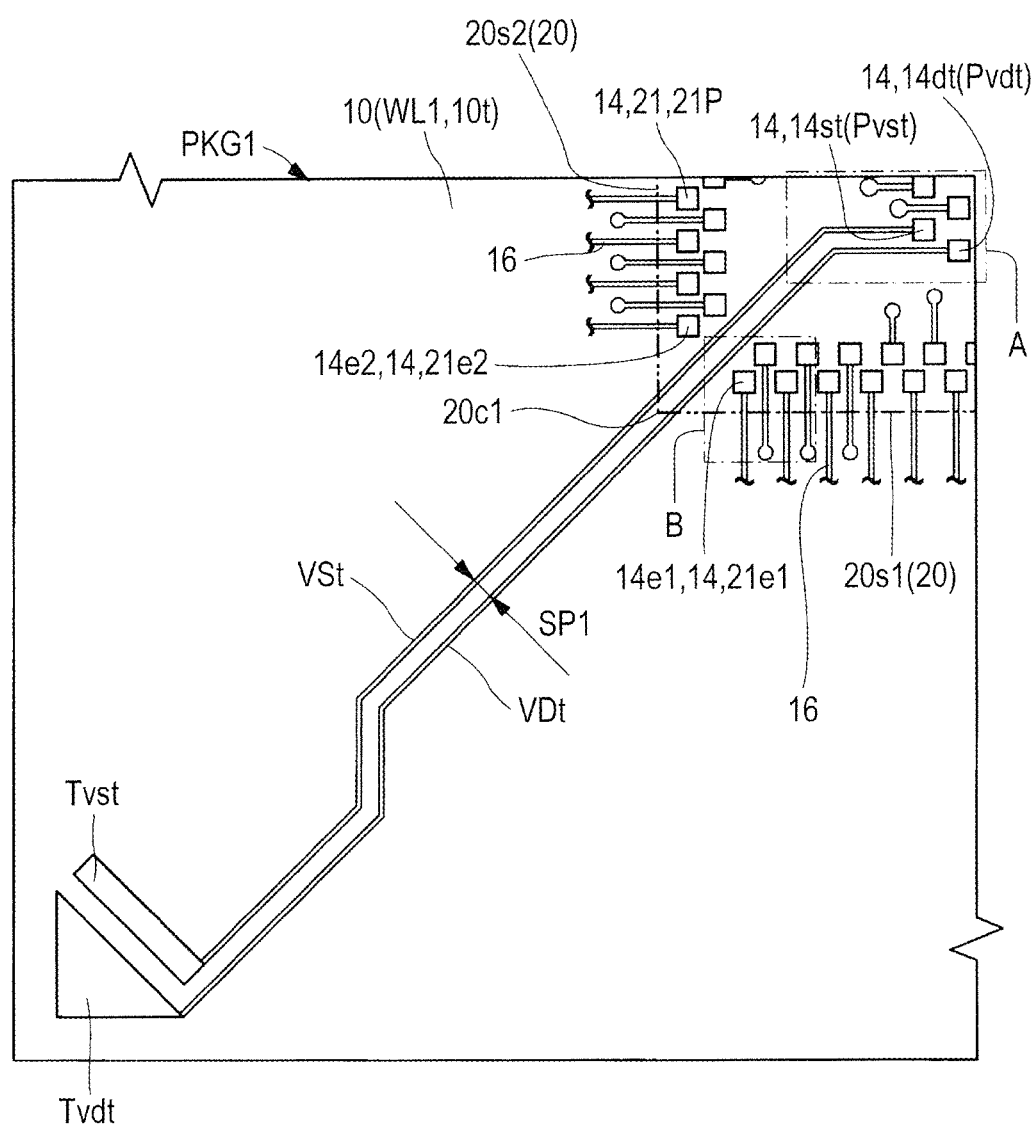
FIG. 6 is an enlarged plan view of an essential part of the uppermost wiring layer among the wiring layers shown in FIG. 3 in area B of FIG. 1.
Figure 21:
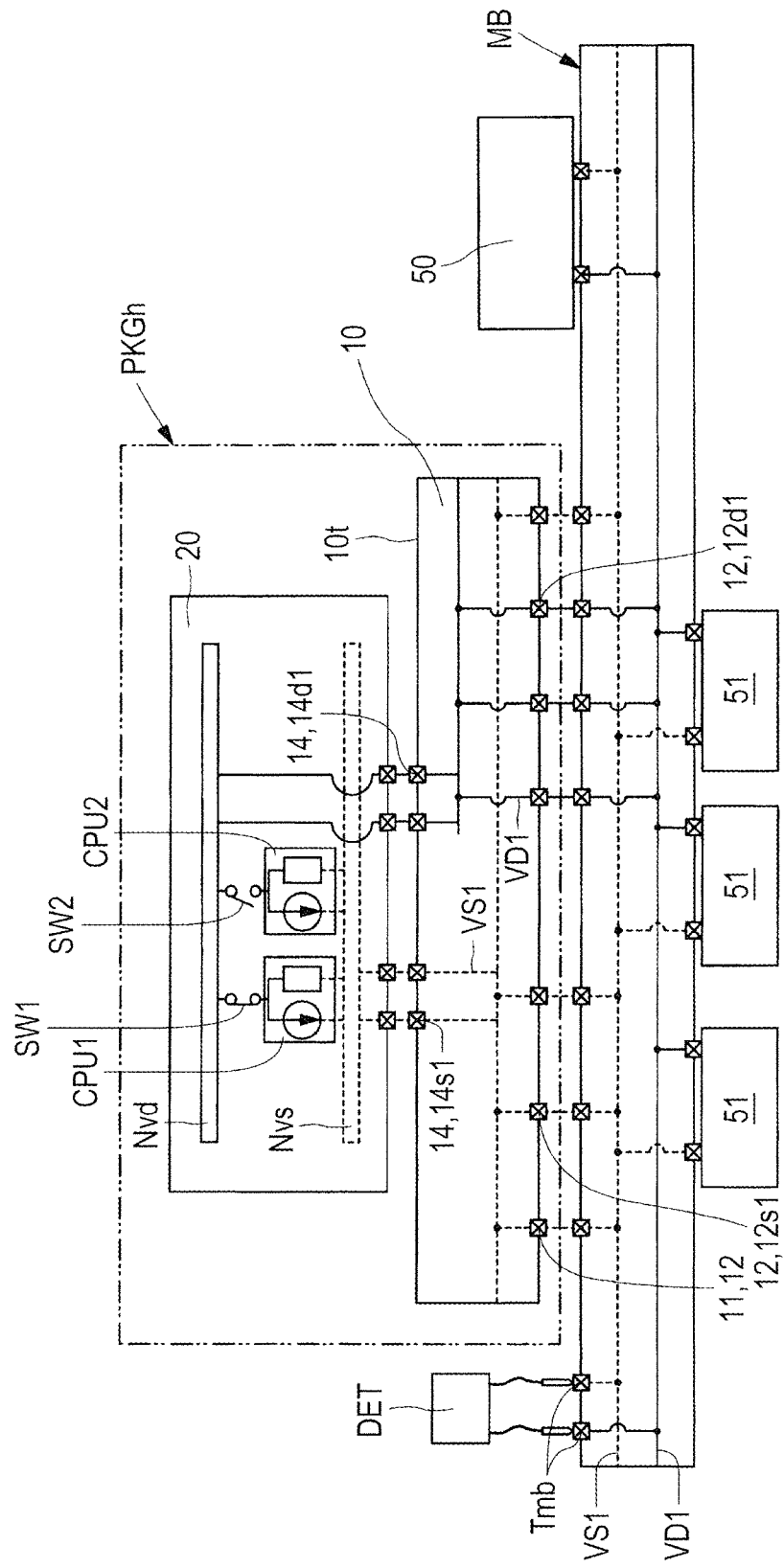
FIG. 21 illustrates a power measuring path different from the power measuring path shown in FIG. 7.

Next, the paths to supply power to the arithmetic processing circuits CPU1 and CPU2 shown in FIG. 5 and the method for measuring the power will be described in detail. FIG. 6 is an enlarged plan view of an essential part of the uppermost wiring layer among the wiring layers shown in FIG. 3 in area B shown in FIG. 1. FIG. 7 schematically illustrates the relation between the power supply path to the core circuits of the semiconductor chip and the power measuring path of the core circuits, with the semiconductor device shown in FIGS. 1 to 3 mounted over the mounting board. FIG. 21 illustrates a power measuring path other than the power measuring path shown in FIG. 7.

As mentioned above, the core circuits such as the arithmetic processing circuits CPU1 and CPU2 consume more power than an input/output circuit such as the interface circuit IF1. Thus the power consumption largely changes with variation in the processing load. Particularly in the case of the semiconductor device PKG1 in which a plurality of core circuits (arithmetic processing circuits CPU1 and CPU2) operate independently as shown in FIG. 5, the electricity demand largely changes according to the operation conditions of the core circuits. If two or more core circuits operate at high load simultaneously, a voltage drop may occur momentarily, causing unstable operation of one or more core circuits.

The change in electricity demand varies according to the operating conditions of the semiconductor device PKG1 (application purpose and operating environment, etc.). For this reason, in order to optimize the power supply to the core circuits and stabilize the operation of the core circuits, a technique to measure the change in the electricity demand of the core circuits (in other words, the change in the power consumption of the core circuits) in an environment where the semiconductor device PKG1 is actually used is needed.

However, it is difficult to measure the change in the power consumption of the core circuits with high accuracy in an environment where the semiconductor device PKG1 is actually used. One possible method for measuring the change in the power consumption of the core circuits in an environment where the semiconductor device PKG1 is actually used is that voltage measuring terminals Tmb are provided on a mounting board MB where a semiconductor device PKGh is mounted and the terminals Tmb are electrically connected with an inspection device DET to measure the voltage, as shown in FIG. 21.

However, in the example shown in FIG. 21, it is difficult to grasp the change in the electricity demand of the core circuits accurately for the following reasons. One reason is that the path distance from the arithmetic processing circuits CPU1 and CPU2 as objects of measurement to the voltage measuring terminals Tmb is long. Therefore, it is likely that there are various noise sources in the measuring circuit. For this reason, the accuracy to measure the change in the electricity demand of the arithmetic processing circuits CPU1 and CPU2 declines.

Another reason is that in the example shown in FIG. 21, capacitors (capacitor components, bypass capacitors) 51 are located between the arithmetic processing circuits CPU1 and CPU2 as core circuits and the power source 50. One electrode of each capacitor 51 is connected with the power supply line VD1 and the other end is connected with the reference potential line VS1. In other words, the capacitors 51 are connected in parallel between the power source 50 and the core circuits (arithmetic processing circuits CPU1 and CPU2).

When the capacitors 51 are located between the power source and the core circuits as mentioned above, if the power consumption of the core circuits suddenly increases, the capacitors 51 function as batteries. Specifically, the capacitors 51 can supply a current to compensate for current shortage caused by the sudden increase in the electricity demand and suppress the voltage drop in the core circuits.

Furthermore, when the capacitors 51 are located between the power source 50 and the core circuits, they function as noise filters which suppress transmission of noise components between the power source 50 and the capacitors 51 to the core circuits. For example, if a potential change (noise) occurs in the power supply line VD1 between the power source 50 and a capacitor 51, the noise is removed by the capacitor 51 and not transmitted to the core circuits. Consequently, power is stably supplied to the core circuits. As mentioned above, the capacitors 51 are electronic components intended to stabilize the operation of the core circuits.

In the example shown in FIG. 21, the capacitors (capacitor components, bypass capacitors) 51 are located between the arithmetic processing circuits CPU1 and CPU2 as objects of measurement and the voltage measuring terminals Tmb. In other words, the capacitors 51 are connected in parallel between the inspection device DET and the core circuits (arithmetic processing circuits CPU1 and CPU2).

However, when the capacitors 51 are located in the measuring path to measure the power consumption of the core circuits as shown in FIG. 21, the data detected by the inspection device DET may be corrected by the capacitors 51. For example, even when the power consumption suddenly increases and current shortage momentarily occurs in the core circuits, the inspection device DET measures the data (for example, voltage data) corrected by the capacitors 51. As a result, it is difficult to grasp the change in the power consumption of the core circuits.

In consideration of the above problem, the present inventors explored a technique to measure the power consumption behavior of the core circuits accurately. First, in order to improve the accuracy in measuring the power consumption behavior of the core circuits, it is desirable to shorten the path distance of the measuring circuit from the circuit as an object of measurement to measuring terminals. However, when measuring terminals are located in the semiconductor chip 20 (see FIG. 21), it is difficult to connect the inspection device DET (see FIG. 21) with the measuring terminals located in the semiconductor chip 20 in an environment where the semiconductor device is actually used.

Therefore, in this embodiment, the terminals Tvdt and Tvst to measure the power (for example, voltage) of the power supply circuit PWR1 (see FIG. 7) to supply power to the core circuits (arithmetic processing circuits CPU1 and CPU2) are located on the wiring substrate 10 as shown in FIGS. 6 and 7.

More specifically, as shown in FIG. 6, the wiring substrate 10 includes a terminal 14*dt* electrically connected with the power supply potential supply section Nvd (see FIG. 5) of the semiconductor chip 20, a terminal Tvdt electrically connected with the terminal 14*dt*, and a wiring VDt electrically connected with the terminals 14*dt* and Tvdt which are located on the upper surface 10*t*. Also, the wiring substrate 10 includes a terminal 14*st* electrically connected with the reference potential supply section Nvs (see FIG. 5) of the semiconductor chip 20, a terminal Tvst electrically connected with the terminal 14*st*, and a wiring VSt electrically connected with the terminals 14*st* and Tvst which are located on the upper surface 10*t*.

The terminal Tvdt is closer to the periphery of the wiring substrate 10 than the terminal 14*dt*. The terminal Tvst is closer to the periphery of the wiring substrate 10 than the terminal 14*st*. In short, the wiring VDt is a lead-out wiring which electrically connects the terminal Tvdt located on the peripheral side of the wiring substrate 10 with the terminal 14*dt* arranged in an area which overlaps the semiconductor chip 20. The wiring VSt is a lead-out wiring which electrically connects the terminal Tvst arranged on the peripheral side of the wiring substrate 10 with the terminal 14*st* arranged in the area which overlaps the semiconductor chip 20.

When the power measuring terminals Tvdt and Tvst are arranged closer to the periphery than to the semiconductor chip 20 on the upper surface 10*t* of the wiring substrate 10 in this way in plan view, it is easy to make them contact the test terminals (for example, needle-like terminals) of the inspection device DET (see FIG. 7) to measure the power of the core circuits. Therefore, the change in the power consumption of the core circuits can be measured with the semiconductor device PKG1 mounted on the mounting board MB (see FIG. 7). When the power measuring terminals Tvdt and Tvst are located on the wiring substrate 10 as in this embodiment, the path distance of the measuring circuit can be shorter than in the example shown in FIG. 21.

In order to improve the accuracy in measuring the power consumption behavior of the core circuits, it is desirable to reduce the influence of noise in the measuring circuit path from the circuit as an object of measurement to the measuring terminal. In this embodiment, since the measuring circuit path distance can be shortened as mentioned above, the influence of noise sources on the measuring circuit can be reduced.

In this embodiment, the wiring VSt is extended along the wiring VSt as shown in FIG. 6. Here, "the wiring VSt is extended along the wiring VSt" means that the wirings VDt and VSt are extended side by side (or run parallel to each other). When the wiring VSt is extended along the wiring VSt in this way, the influence of noise on either the wiring VDt or the wiring VSt can be prevented.

When the potential difference between the terminals Tvdt and Tvst is measured, if one of the wirings VDt and VSt is influenced by noise and the other is not influenced by noise, the influence of noise is reflected in the measurement result. If both the wirings VDt and VSt are influenced in the same way, the influences of noise are offset by each other.

According to this embodiment, since the wirings VDt and VSt are extended side by side, even if there is a noise source near the measuring circuit, the wirings VDt and VSt are influenced by noise in the same way. For this reason, the influence of noise is hardly reflected in the measurement result and the accuracy in measuring the power consumption behavior of the core circuits can be improved.

In the example shown in FIG. 6, the wirings VDt and VSt are extended adjacent to each other in the entire zone from the point of connection with the terminal 14*dt* or 14*st* to the point of connection with the terminal Tvdt or Tvst. Therefore, no other conductive pattern is formed between the wirings VDt and VSt. Depending on the restriction on wiring layout, another conductive pattern may be arranged in part of the area between the wirings VDt and VSt. However, for the purpose of enabling the influences of noise on the wirings VDt and VSt to be offset by each other, it is desirable that no other conductive pattern be formed between the wirings VDt and VSt as shown in FIG. 6.

In the example shown in FIG. 6, the wirings VDt and VSt run parallel to each other with a constant spacing SP1 in the entire zone from the point of connection with the terminal 14*dt* or 14*st* to the point of connection with the terminal Tvdt or Tvst. In order to enable the influences of noise on the wirings VDt and VSt to be offset by each other, it is desirable that the spacing SP1 between the wirings VDt and VSt be narrow.

Depending on the restriction on wiring layout, etc., the spacing SP1 may change in part of the zone from the point of connection with the terminal Tvdt or TVst to the point of connection with the terminal Tvdt or Tvst. Here, "constant spacing SP1" means that the value of the spacing SP1 is almost constant within the allowable range to enable the influences of noise on the wirings VDt and VSt to be offset by each other.

Therefore, even if the spacing is somewhat non-constant, for example, due to a processing accuracy problem, it may be considered as "constant spacing SP1" as mentioned above. Furthermore, around the point of connection between a wiring and a terminal, the wiring may be detoured depending on the relation between the arrangement of terminals and the direction of extension of the wiring. In this case, however, the detouring part is included in the point of connection with the terminal 14dt or 14st or the point of connection with the terminal Tvdt or Tvst, but not included in the above entire zone. Furthermore, although the wirings VDt and VSt are formed only in the wiring layer WL1 as shown in FIG. 6, instead the wirings VDt and VSt may be partially formed in a wiring layer other than the wiring layer WL1. If that is the case, the wirings may be partially detoured at the point of connection with an interlayer conduction path such as a via wiring 16V shown in FIG. 3. In this case as well, the detouring part is not included in the above entire zone.

<Preferred Modes>

Next, the preferred modes of the detailed configuration of this embodiment will be described.

First, in order to reduce the influence of noise on the measuring circuit, preferably the terminals Tvdt and Tvst and wirings VDt and VSt which configure the measuring circuit should not be the same terminals and wirings that configure the power supply circuit, as shown in FIG. 7. In other words, preferably the terminals 14dt and 14st should be special terminals for the measuring circuit which are isolated from the power supply circuit.

Specifically, as shown in FIG. 7, a plurality of bonding fingers 14 formed on the upper surface 10t of the wiring substrate 10 include power supply potential terminals 14dt which supply a power supply potential to the power supply potential supply section Nvd of the semiconductor chip 20. The bonding fingers 14 also include reference potential terminals 14s1 which supply a reference potential to the reference potential supply section Nvs of the semiconductor chip 20.

A plurality of lands 12 formed on the lower surface 10b of the wiring substrate 10 include power supply potential terminals 12d1 which are electrically connected with the power supply potential terminals 14dt through the power supply line (power supply potential wiring path) VD1. The lands 12 also include reference potential terminals 12s1 which are electrically connected with the reference potential terminals 14s1 through the reference potential line (reference potential wiring path) VS1.

The wiring VDt is electrically isolated from the power supply line VD1. The wiring VSt is electrically isolated from the reference potential line VS1. In short, the wirings VDt and VSt are electrically isolated from the power supply line VD1 and reference potential line VS1, respectively. In other words, the terminals 14dt and 14st are special terminals for the measuring circuit which are isolated from the power supply line VD1 and reference potential line VS1. Since the wirings VDt and VSt are isolated from the power supply line VD1 and reference potential line VS1 respectively as mentioned above, the measuring circuit is less likely to be influenced by noise attributable to the power supply line VD1, etc.

The wiring VDt is electrically connected with the power supply line VD1 through the power supply potential supply section Nvd as a node in the semiconductor chip 20. The wiring VSt is electrically connected with the reference potential line VS1 through the reference potential supply section Nvs as a node in the semiconductor chip 20. Strictly speaking, in the configuration shown in FIG. 7, the wiring VDt is electrically isolated from the power supply line VD1 except the path electrically connected with the power supply line VD1 through the power supply potential supply section Nvd of the semiconductor chip 20. Similarly, the wiring VSt is electrically isolated from the reference potential line VS1 except the path electrically connected with the reference potential line VS1 through the reference potential supply section Nvs of the semiconductor chip 20.

In this embodiment, the measuring circuit measures the change in the power consumption of the arithmetic processing circuits CPU1 and CPU2 as core circuits. Therefore, the change in power (for example, change in voltage) at the node (power supply circuit PWR1) in the semiconductor chip 20 to supply power to the core circuits may be considered as equivalent to the change in the power consumption of the core circuits. Thus, even when in the power supply circuit PWR1 the measuring circuit and the circuit for power supply (power supply line VD1 and reference potential line VS1) are electrically connected, the change in the power consumption of the core circuits can be measured with high accuracy. Consequently, from the viewpoint of measuring the change in the power consumption of the core circuits, the configuration shown in FIG. 7 may be considered as a configuration in which "the wiring VDt is electrically isolated from the power supply line VD1 and the wiring VSt is electrically isolated from the reference potential line VS1".

A configuration as shown in FIG. 7 in which the measuring circuit and power supply circuit are electrically isolated may be expressed as follows: the terminals Tvdt and Tvst are electrically isolated from the lands 12. As mentioned above, strictly speaking, in the configuration shown in FIG. 7, the terminal Tvdt is electrically isolated from the lands 12 except the path electrically connected with the power supply potential terminal 12d1 through the power supply potential supply section Nvd of the semiconductor chip 20. The terminal Tvst is also electrically isolated from the lands 12 except the path electrically connected with the reference potential terminal 12s1 through the reference potential supply section Nvs of the semiconductor chip 20. As mentioned above, from the viewpoint of measuring the change in the power consumption of the core circuits, the configuration shown in FIG. 7 may be considered as a configuration in which "the terminals Tvdt and Tvst are electrically isolated from the lands 12".

In order to stabilize the operation of core circuits such as the arithmetic processing circuits CPU1 and CPU2, preferably the lengths of the power supply line VD1 and reference potential line VS1 should be short. When the capacitors 51 electrically connected with the power supply path are mounted on the mounting board MB as shown in FIG. 7, preferably the path distance from the capacitors 51 to the core circuits should be short.

For this reason, preferably among the lands 12, the power supply potential terminal 12d1 and reference potential terminal 12s1 should be arranged so as to overlap the semiconductor chip 20 as shown in FIG. 7. Although FIG. 7 is a schematic diagram and does not show the positional relation between the semiconductor chip 20 and the lands 12 in an easy-to-understand manner, preferably among the lands 12, some lands 12 located so as to overlap the semiconductor chip 20 should be used as the power supply potential terminal 12d1 and reference potential terminal 12s1, as shown in FIG. 3. In the example shown in FIG. 3, the power supply potential terminal 12d1 and reference potential terminal 12s1 are located so as to overlap several center electrodes 21c.

When the power supply potential terminal 12d1 and reference potential terminal 12s1 are arranged so as to overlap the semiconductor chip 20 in this way, the path distances of the power supply line VD1 (see FIG. 7) and reference potential line VS1 (see FIG. 7) can be shortened.

Consequently the core circuits such as the arithmetic processing circuits CPU1 and CPU2 can operate stably.

Furthermore, when the power supply line VD1 and reference potential line VS1 are arranged mainly in the area which overlaps the semiconductor chip 20 as shown in FIG. 7, the wirings VDt and VSt which configure the measuring circuit can be electrically isolated from the power supply circuit easily.

As mentioned earlier, the terminals Tvdt and Tvst shown in FIG. 6 are terminals for measuring the power consumption behavior of the core circuits (arithmetic processing circuits CPU1 and CPU2 shown in FIG. 5). The wiring VDt connected with the terminal Tvdt and the wiring VSt connected with the Tvst are lead-out wirings for measuring the power consumption behavior of the core circuits.

Thus, the influence of the terminals Tvdt and Tvst and wirings VDt and VSt on other circuits through the power supply circuit PWR1 (see FIG. 5) should be minimized while power measurement is not underway. In order to reduce the influence of the terminals Tvdt and Tvst and wirings VDt and VSt on other circuits while power measurement is not underway, preferably a current should hardly flow in the wirings VDt and VSt while measurement is not underway.

For example, as shown in FIG. 7, preferably the terminals Tvdt and Tvst should not configure a circuit before the inspection device DET is connected. In other words, preferably the terminal Tvdt should not be connected with a conductive pattern other than the wiring VDt. This means that the signal transmission path which is located on the wiring substrate 10 and connected with the power supply potential supply section Nvd as a node in the semiconductor chip 20 and includes the terminal 14dt, wiring VDt, and terminal Tvdt should be terminated with the terminal Tvdt. Preferably the terminal Tvst should not be connected with a conductive pattern other than the wiring VSt. This means that the signal transmission path which is located on the wiring substrate 10 and connected with the reference potential supply section Nvs as a node in the semiconductor chip 20 and includes the terminal 14st, wiring VSt, and terminal Tvst should be terminated with the terminal Tvst.

When the terminals Tvdt and Tvst are not connected with a conductive pattern other than the wirings VDt and VSt, a current hardly flows in the wirings VDt and VSt. Consequently, the influence of the terminals Tvdt and Tvst and wirings VDt and VSt on other circuits can be reduced while power measurement is underway.

Figure 8:
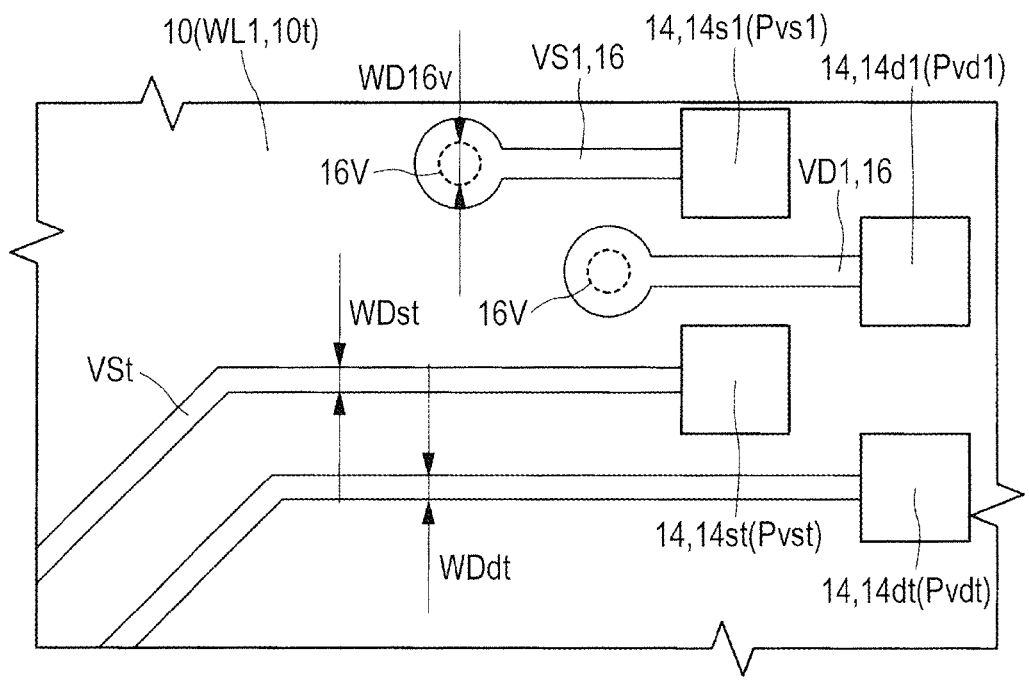
FIG. 8 is an enlarged plan view of area A of FIG. 6.

When the change in the power consumption of the core circuits is measured, the current which flows in the measuring circuit may be smaller than the current which flows in the power supply line VD1 shown in 5. Therefore, preferably the width of the wiring VDt and the width of the wiring VSt should be small. FIG. 8 is an enlarged plan view of area A of FIG. 6 and FIG. 9 is an enlarged plan view of area B of FIG. 6.

For example, as shown in FIG. 8, in this embodiment, the width WDdt of the wiring VDt and the width WDst of the wiring VSt are smaller than at least the width WD16v of the reference potential via wiring 16V as a portion of the reference potential line VS1 among the via wirings 16V electrically connecting stacked wiring layers. In this embodiment, the reference potential via wiring 16V as a portion of the reference potential line VS1, the power supply potential via wiring 16V as a portion of the power supply line VD1, and the via wiring 16V (see FIG. 9) as a portion of the signal line SIG as the signal transmission path (see FIG. 9) have the same width. Therefore, the width WDdt of the wiring VDt and the width WDst of the wiring VSt are smaller than the width WD16v of each of the via wirings 16V electrically connecting stacked wiring layers.

In the example shown in FIG. 8, the width WDdt of the wiring VDt and the width WDst of the wiring VSt are smaller than the width of the wiring portion of the power supply line VD1 (wiring 16 as an extension to connect a bonding finger 14 and a via land over a via wiring 16V) and the width of the wiring portion of the reference potential line VS1.

Figure 9:
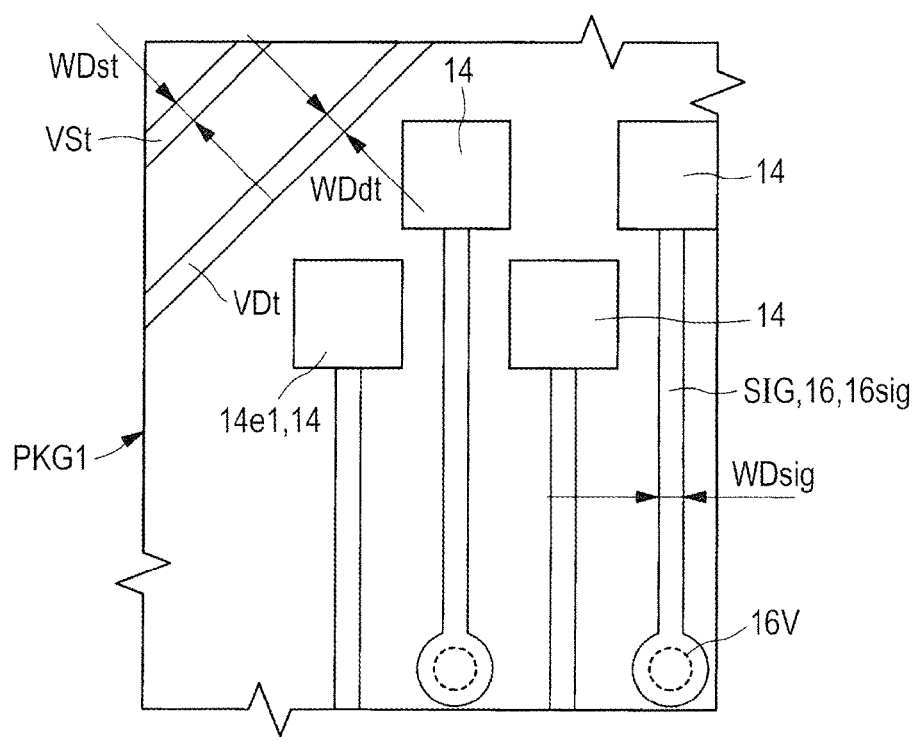
FIG. 9 is an enlarged plan view of area B of FIG. 6.

As shown in FIG. 9, the width WDdt of the wiring VDt and the width WDst of the wiring VSt are smaller than the width WDsig of the wiring (signal wiring) 16sig as a portion of the signal line SIG. In the example shown in FIG. 9, the width WDdt of the wiring VDt, the width WDst of the wiring VSt, and the width WDsig of the wiring 16sig are equal. The wiring width WDsig is decreased and the width WDdt of the wiring VDt and the width WDst of the wiring VSt are decreased so that the arrangement density of signal lines SIG and the number of signal transmission paths per unit area are increased. As a result, these widths are equal. It is more preferable that the width WDdt of the wiring VDt and the width WDst of the wiring VSt be smaller than the width WDsig of the wiring 16sig, if possible.

As mentioned above, in this embodiment, the width WDdt of the wiring VDt is equal to the width WDst of the wiring VSt. In this case, if the wirings VDt and VSt are influenced by an external noise source, the degree of noise penetration can be the same between the wiring paths. As a result, the wirings VDt and VSt are influenced by noise equally, so the influences of noise are offset by each other. Here, "wiring widths are equal" means that wirings are equal in terms of design wiring width and even if the actual wiring widths have small errors as caused by the influence of processing accuracy or the influence of layout, the wiring widths may be considered as "equal" as mentioned above.

As mentioned earlier, in this embodiment, the semiconductor chip 20 is mounted with the front surface 20t facing to the upper surface 10t of the wiring substrate 10 (face-down mounting method) as shown in FIG. 3. Thus, the pads 21 of the semiconductor chip 20 and the bonding fingers 14 of the wiring substrate 10 face to each other. Specifically, the bonding fingers 14 and terminals 14dt and 14st are arranged so as to overlap the semiconductor chip 20 in plan view, as shown in FIG. 6.

When the semiconductor chip 20 is mounted over the wiring substrate 10 by the face-down mounting method, the joint between the semiconductor chip 20 and the wiring substrate 10 must be peeled off in order to connect the terminals 14dt and 14st shown in FIG. 6 with the terminals of the inspection device DET (see FIG. 7). On the other hand, when the terminals Tvdt and Tvst are arranged so as not to overlap the semiconductor chip 20 as shown in FIG. 6, the inspection device DET can be connected with the measuring circuit with the semiconductor chip 20 connected with the wiring substrate 10 as shown in FIG. 7.

Furthermore, in this embodiment, the terminals 14dt and 14st shown in FIG. 6 are connected with one or more of the center electrodes 21C among the pads 21 of the semiconductor chip 20 as shown in FIG. 4. In this case, it is preferable that the wirings VDt and VSt as lead-out wirings be arranged so as not to interfere with the arrangement of the other wirings 16 connected with the bonding fingers 14.

For this reason, in this embodiment, the wirings VDt and VSt are arranged so as to run in the vicinity of a corner of the semiconductor chip 20 in plan view. More specifically, as shown in FIG. 4, the peripheral electrodes 21P of the semiconductor chip 20 include the pad (electrode) 21e1 nearest to the corner 20c1 among the pads 21 arranged along the side 20s1 and the pad (electrode) 21e2 nearest to the corner 20c1 among the pads 21 arranged along the side 20s2. Also, as shown in FIG. 6, the wirings VDt and VSt partially overlap the area between the pads 21e1 and 21e2 of the semiconductor chip 20 in plan view.

In other words, as shown in FIG. 6, the bonding fingers 14 of the wiring substrate 10 include the bonding finger 14e1 nearest to the corner 20c1 of the semiconductor chip 20 among the bonding fingers 14 arranged along the side 20s1 of the semiconductor chip 20 in plan view. Also, the bonding fingers 14 of the wiring substrate 10 include the bonding finger 14e2 nearest to the corner 20c1 of the semiconductor chip 20 among the bonding fingers 14 arranged along the side 20s2 of the semiconductor chip 20 in plan view. Also, the wirings VDt and VSt partially overlap the area between the bonding fingers 14e1 and 14e2 in plan view.

The wirings 16 shown in FIG. 6 are extended in the directions intersecting with the sides 20s1 and 20s2 of the semiconductor chip 20. Therefore, when the wirings VDt and VSt are arranged so as to run in the vicinity of the corner 20c1 of the semiconductor chip 20 as shown in FIG. 6, the wirings VDt and VSt hardly interfere with the arrangement of the wirings 16.

In the example shown in FIG. 6, the terminals Tvdt and Tvst are located on the upper surface 10t of the wiring substrate 10. In this case, the path distance of the measuring circuit can be shorter than when the terminals Tvdt and Tvst are located on the lower surface 10b of the wiring substrate 10.

In the example shown in FIG. 6, the wirings VDt and VSt are formed in the same wiring layer (wiring layer WL1 in the example shown in FIG. 6). In order to reduce the noise components in the wiring path, it is desirable to reduce impedance discontinuity points in the wiring path. The reason is that if there is an impedance discontinuity point in the wiring path, a signal is partially attenuated by reflection. An impedance discontinuity point is easily generated in a portion of the wiring path where the wiring structurally changes. For example, impedance discontinuity points are more easily generated in the via wirings 16V electrically connecting several wiring layers (see FIG. 3) than in the wirings 16. The through hole wirings 16T shown in FIG. 3 tend to generate impedance discontinuity points with a larger level difference than the via wirings 16V.

Therefore, when the wirings VDt and VSt are formed in the same wiring layer, the number of via wirings 16 V and the number of through hole wirings which are included in the power supply potential measuring path and the reference potential measuring path can be the same. In this case, the noise sources in the power supply potential measuring path can be the same as those in the reference potential measuring path, so the influences of noise due to impedance discontinuity points can be offset by each other.

When the wirings VDt and VSt are formed in the uppermost wiring layer (wiring layer in which the terminals Tvdt and Tvst and terminals 14dt and 14st are formed) WL1 and not formed in any other wiring layer as shown in FIG. 6, the via wirings 16V and through hole wirings 16T shown in FIG. 3 do not exist in the measuring circuit, so the influence of noise due to impedance discontinuity points is reduced.

As shown in FIG. 1, the upper surface 10t of the wiring substrate 10 is covered by the insulating film 13t. The terminals Tvdt and Tvst are exposed from the insulating film 13t in an opening made in the insulating film 13t. Since the insulating film 13t is an organic insulating film called a solder resist film, from the viewpoint of measuring the change in electric power it is acceptable that the terminals Tvdt and Tvst be covered by the insulating film 13t.

However, when the terminals Tvdt and Tvst are exposed from the insulating film 13t, the terminals Tvdt and Tvst function as an index mark for identifying the orientation of the semiconductor device PKG1. The index mark may be a mark in one of the four corners of the rectangular semiconductor device PKG1 in plan view, which differentiates that corner from the other three corners. Therefore, at least one of the terminals Tvdt and Tvst should be exposed from the insulating film 13t.

When the terminal Tvdt or Tvst is used as an index mark, it is desirable that the exposed area of the terminal Tvdt or Tvst be the largest among the exposed areas of the conductive patterns exposed from the insulating film 13t on the upper surface 10t of the wiring substrate 10. If so, its visibility as an index mark is increased.

<Semiconductor Device Manufacturing Method>

Figure 10:
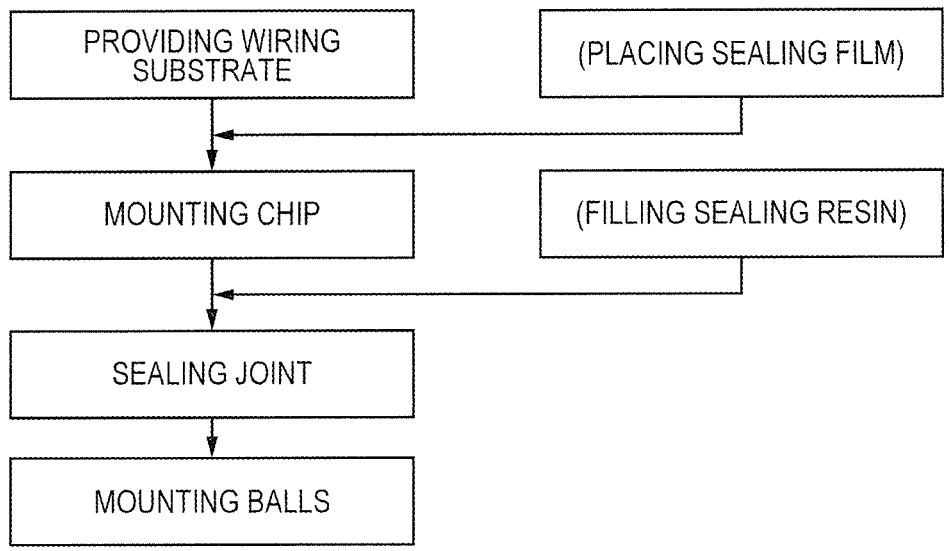
FIG. 10 is an explanatory diagram which gives an outline of the process of manufacturing the semiconductor device described referring to FIGS. 1 to 9.

Next, the process of manufacturing the semiconductor device PKG1 described above referring to FIGS. 1 to 9 will be explained. The explanation below will be given referring to the flow diagram showing the manufacturing process and FIGS. 1 to 8 as necessary. FIG. 10 is an explanatory diagram which gives an outline of the process of manufacturing the semiconductor device described referring to FIGS. 1 to 9. In order to simplify the explanation of this embodiment, it is assumed that the semiconductor chip 20 is mounted over the wiring substrate 10 shown in FIG. 3. An alternative manufacturing process may be adopted as follows: a multi-chip substrate with a plurality of product formation regions which corresponds to the wiring substrate 10 is provided and after assembling a plurality of semiconductor devices simultaneously, the substrate is divided into individual pieces which correspond to product formation regions. If that is the case, the assembling process is more streamlined.

<Providing a Wiring Substrate>

Figure 11:
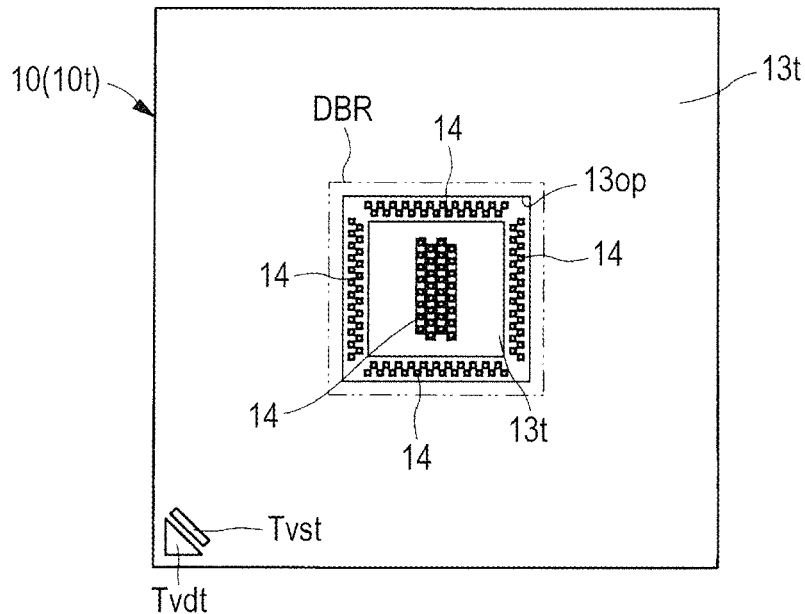
FIG. 11 is a plan view showing the chip mounting surface side of the wiring substrate provided at the step of providing a wiring substrate as shown in FIG. 10.

First, at the step of providing a wiring substrate, the wiring substrate 10 shown in FIG. 3 is provided. FIG. 11 is a plan view showing the chip mounting surface side of the wiring substrate provided at the step of providing a wiring substrate as shown in FIG. 10. The wiring substrate 10 provided at this step has a chip mounting region DBR (region in which the semiconductor chip shown in FIG. 3 is to be mounted) on the upper surface 10t and a plurality of bonding fingers 14 exposed from the insulating film 13t are formed in an opening 13op inside the chip mounting region DBR.

As shown in FIG. 3, a plurality of lands (terminals, external terminals) 12 are formed on the lower surface (back surface, mounting surface) 10b (see FIG. 3) which is opposite to the upper surface 10t of the wiring substrate 10. In the wiring substrate 10 provided at this step, the lands 12 are not connected with the solder balls 11 shown in FIG. 3 and the lands 12 are exposed from the insulating film (solder resist film) 13b in the opening.

In the wiring substrate 10 provided at this step, terminals Tvdt and Tvst are formed. The terminals Tvdt and Tvst have already been described in detail and their description is omitted here.

<Mounting a Chip>

Figure 12:
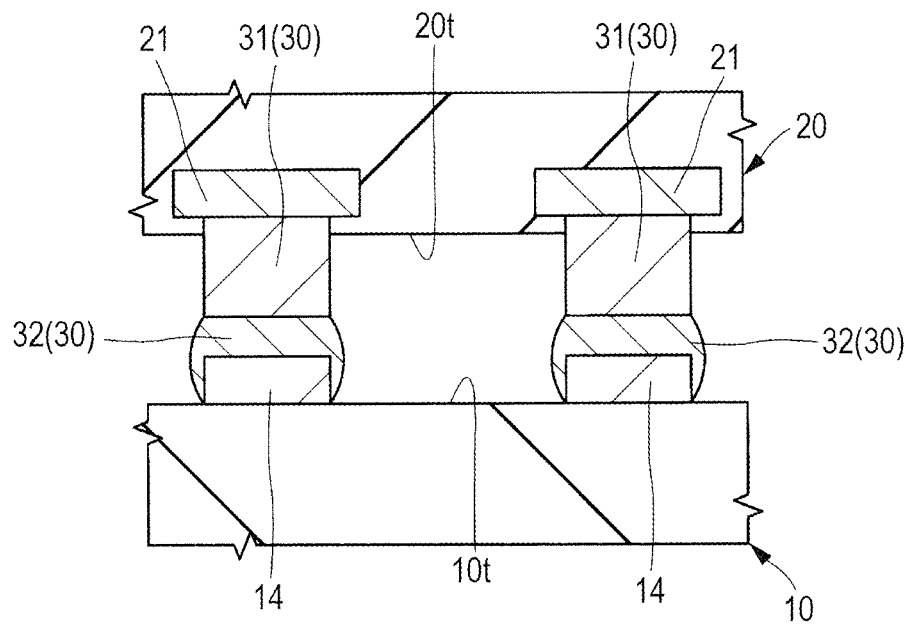
FIG. 12 is an enlarged sectional view showing the electrical connection between a pad 21 and a bonding finger 14 as shown in FIG. 3.

Next, at the step of mounting a chip, a semiconductor chip 20 is mounted in the chip mounting region DBR (see FIG. 11) of the wiring substrate 10 as shown in FIG. 3. FIG. 12 is an enlarged sectional view showing the electrical connection between a pad 21 and a bonding finger 14 as shown in FIG. 3.

At the step of mounting a chip, the semiconductor chip 20 is mounted over the upper surface 10t of the wiring substrate 10 as shown in FIG. 3. A this step, the semiconductor chip 20 is mounted in a manner that the front surface 20t of the semiconductor chip 20 and the upper surface 10t of the wiring substrate 10 (specifically, the upper surface of the insulating film 13t) face to each other.

At this step, a plurality of pads 21 of the semiconductor chip 20 and a plurality of bonding fingers 14 of the wiring substrate 10 are electrically connected through a plurality of bump electrodes (conductive members) 30 as shown in FIG. 12.

In the example shown in FIG. 12, a bump electrode 30 is, for example, a conductive column of copper (Cu) (conductive member, protruding electrode) 31 with one end joined to a pad 21 and the other end connected with a solder member 32. The bump electrode 30 may be modified in various ways and the shape of the conductive column is not limited to the shape shown in FIG. 12. Alternatively, the conductive column 31 may be omitted so that the solder member 32 is directly connected with both the pad 21 and bonding finger 14. The metal material of the bump electrode 30 is not limited to copper (Cu) and it may be gold (Au) or the like.

<Sealing a Joint>

Figure 13:
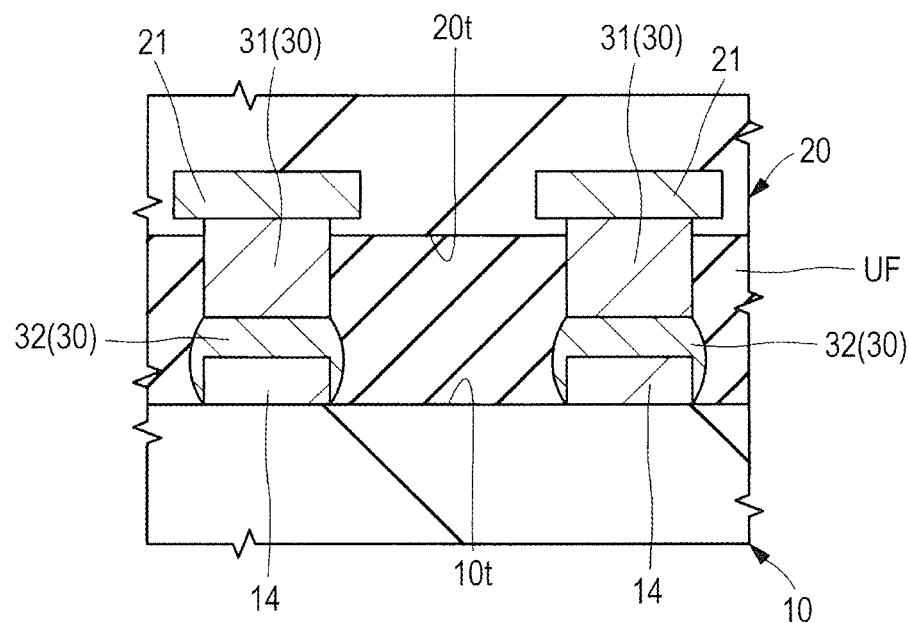
FIG. 13 is an enlarged sectional view showing the sealed joint between an electrode of the semiconductor chip and a terminal of the wiring substrate with resin between the semiconductor chip and wiring substrate shown in FIG. 12.

Next, at the step of sealing a joint, the areas around the bump electrodes 30 are sealed with an insulating material such as resin. FIG. 13 is an enlarged sectional view showing the sealed joint between an electrode of the semiconductor chip and a terminal of the wiring substrate with resin put between the semiconductor chip and the wiring substrate which are shown in FIG. 12.

In the example shown in FIG. 13, underfill resin UF is supplied between the semiconductor chip 20 and the wiring substrate 10 to cover the areas around the bump electrodes 30 (the step of filling sealing resin, shown in FIG. 10). After that, at the step of sealing a joint, the bump electrodes 30 are sealed by letting the underfill resin UF harden. The joints of the bump electrodes 30 are protected by putting the underfill resin UF so as to cover the areas around the bump electrodes 30 and letting it harden.

According to the process explained above, sealing resin is filled after the step of mounting a chip. However, the method for sealing a joint may be modified in various ways. For example, before the step of mounting a chip as shown in FIG. 10, a resin film (sealing film) may be placed in the chip mounting region DBR shown in FIG. 11 (the step of placing a sealing film as shown in FIG. 10) and then the step of mounting a chip may be carried out. As another example, before the step of mounting a chip as shown in FIG. 10, a resin film (sealing film) in the form of a paste may be coated on the chip mounting region DBR shown in FIG. 11 (the step of placing a sealing film as shown in FIG. 10) and then the step of mounting a chip may be carried out.

<Mounting Balls>

Next, at the step of mounting balls, a plurality of solder balls 11 to become external terminals are joined to a plurality of lands 12 formed on the lower surface 10b of the wiring substrate 10, as shown in FIG. 3.

At this step, the wiring substrate 10 is placed with its lower surface 10b up and then a solder ball 11 is placed over each of the lands 12 exposed on the lower surface 10b of the wiring substrate 10. After that, the solder balls 11 and the lands 12 are joined by heating the solder balls. At this step, the solder balls 11 are electrically connected with the semiconductor chip 20 through the wiring substrate 10.

However, the application of the technique in this embodiment is not limited to so-called BGA (Ball Grid Array) semiconductor devices in which solder balls 11 are joined in an array pattern. For example, as a variation of this embodiment, the technique can be applied to so-called LGA (Land Grid Array) semiconductor devices in which no solder balls 11 are formed and lands 12 are exposed or a thinner coating of solder paste than solder balls 11 is applied to lands 12 before shipment. In the case of LGA semiconductor devices, the step of mounting balls can be omitted.

The invention made by the present inventors has been so far explained concretely in reference to the preferred embodiment thereof. However, the invention is not limited to the above embodiment and it is obvious that these details may be modified in various ways without departing from the gist thereof.

<Variation 1>

In the above embodiment, it is assumed that the semiconductor chip 20 has a plurality of core circuits (arithmetic processing circuits CPU1 and CPU2). However, the number of core circuits may be varied. If the number of core circuits is 3 or more, power consumption changes more largely. Even if it has only one core circuit, operation of the core circuit may become unstable. In this case, if the technique in the above embodiment is applied to the semiconductor device, the change in the electricity demand of the core circuit(s) can be measured while the semiconductor device is actually used.

In the above embodiment, the core circuits operate independently of each other on the assumption that a switch SW1 is provided between the arithmetic processing circuit CPU1 and the power supply circuit PWR1 and a switch SW2 is provided between the arithmetic processing circuit CPU2 and the power supply circuit PWR1. However, other various methods which enable the arithmetic processing circuits CPU1 and CPU2 to perform different processing tasks or mutually related processing tasks concurrently are available.

For example, if a switch SW1 is not provided between the arithmetic processing circuit CPU1 and the power supply circuit PWR1 though a switch SW2 is provided between the arithmetic processing circuit CPU2 and the power supply circuit PWR1, the arithmetic processing circuit CPU2 can be turned on or off. In this case, while the semiconductor device PKG1 is in operation, the arithmetic processing circuit CPU1 remains on and the arithmetic processing circuit CPU2 can be turned on or off according to the load on the arithmetic processing circuit CPU1.

<Variation 2>

In the above embodiment, as shown in FIG. 6, the terminals 14dt and 14st connected with the wirings VDt and VSt which configure the measuring circuit are connected with center electrodes 21C among the pads 21 shown in FIG. 4.

However, instead, the terminals 14dt and 14st connected with the wirings VDt and VSt which configure the measuring circuit may be connected with peripheral electrodes 21P among the pads 21 shown in FIG. 4.

If the core circuits are located closer to the peripheral electrodes 21P than to the center electrodes 21C, the power supply path to supply power to the core circuits can be shorter when it runs through the peripheral electrodes 21P than when it runs through the central electrodes 21C. In this case, when the terminals 14dt and 14st shown in FIG. 7 are connected with peripheral electrodes 21P among the pads 21 shown in FIG. 4, the path distance of the measuring circuit is shortened.

When the terminals 14*dt* and 14*st* are connected with peripheral electrodes 21P among the pads 21 shown in FIG. 4 as in the above variation, the wirings VDt and VSt shown in FIG. 7 need not run through the area between the bonding fingers 14*e*1 and 14*e*2 shown in FIG. 6.

<Variation 3>

Figure 14:
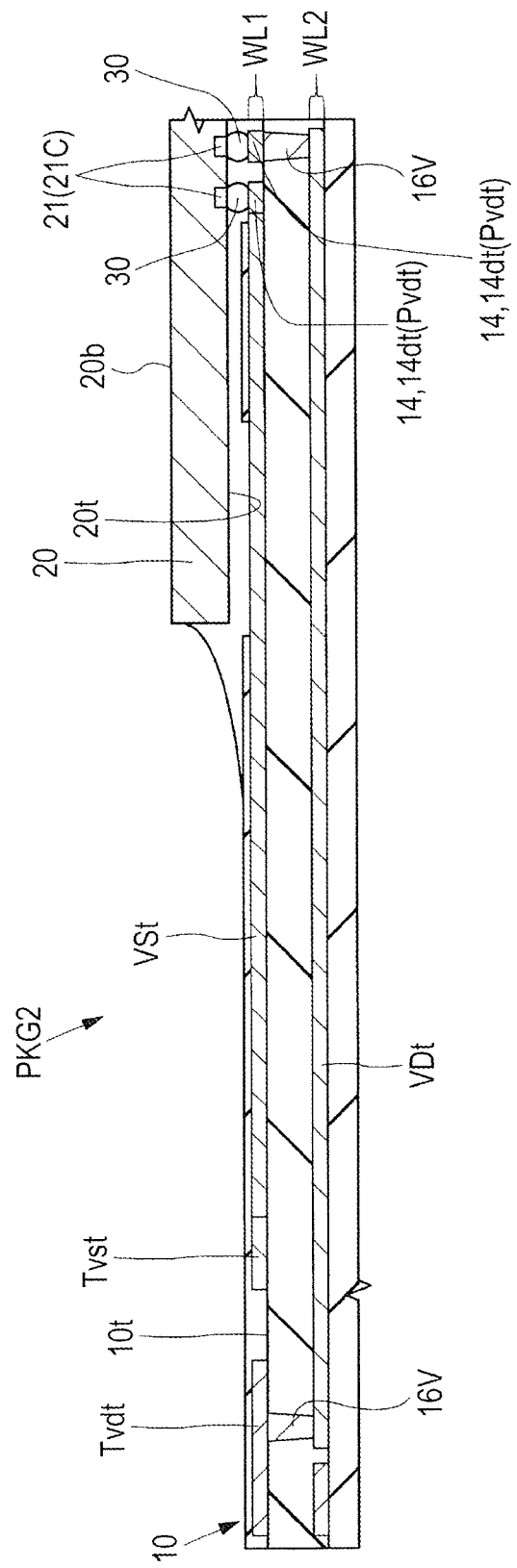
FIG. 14 is an enlarged sectional view showing a modification to the wiring layout of the measuring circuit shown in FIG. 6.

In the example shown in FIG. 6, the wirings VDt and VSt are laid in the same wiring layer WL1. However, the wiring layout in which the wiring VSt is extended along the wiring VDt (namely the wirings VSt and VDt run parallel to each other) may be modified in various ways. FIG. 14 is an enlarged sectional view showing a modification to the wiring layout of the measuring circuit shown in FIG. 6.

For example, the semiconductor device PKG2 shown in FIG. 14 is different from the semiconductor device PKG1 shown in FIG. 6 in that the wirings VDt and VSt which configure the measuring circuit shon in FIG. 7 are formed in different wiring layers.

More specifically, in the semiconductor device PKG2, the wiring VDt is formed in the wiring layer WL2 among the wiring layers of the wiring substrate 10 and the wiring VSt is formed in the wiring layer WL1 adjacently stacked over the wiring layer WL2. The wiring VDT overlaps the wiring VST.

In this variation as well, the wiring VSt is extended along the wiring VDt. In other words, the wirings VDt and VSt run parallel to each other.

In the wiring layout in this variation, each of the wiring layers WL1 and WL2 requires space for only one wiring. For this reason, for a wiring substrate with a high wiring density, this wiring layout is useful when it is difficult to provide space for two wirings VDt and VSt.

However, as shown in FIG. 14, the power supply potential measuring path which includes the wiring VDt has two more via wirings 16V than the reference potential measuring path which includes the wiring VSt. Therefore, in order to ensure that the number of impedance discontinuity points is the same between the wirings VDt and VSt, it is desirable that the wirings VDt and VSt be formed in the same wiring layer as shown in FIG. 6.

As a further modification to this modification, the wirings VDt and VSt may be formed in a wiring layer other than the wiring layers WL1 and WL2. However, in order to decrease the number of via wirings 16V in the measuring circuits, it is desirable that the wirings VDt and VSt be formed in a wiring layer which is as near to the semiconductor chip 20 as possible.

As mentioned above, in order to ensure that the influence of noise on the power supply potential measuring path and the influence of noise on the reference potential measuring path are offset by each other, it is desirable that no other conductive pattern be formed between the wirings VDt and VSt. Therefore, if the wirings VDt and VSt are formed in different wiring layers, it is desirable that they be formed in wiring layers which are stacked adjacently to each other as shown in FIG. 14.

<Variation 4>

In the above embodiment, the measuring path for measuring the change in the power consumption of the core circuits and the power supply path for supplying power to the core circuits are separated as shown in FIGS. 5 and 7. In this case, the measuring circuit requires special terminals 14*dt* and 14*st* and pads 21 which are electrically isolated from the power supply circuit. As mentioned above, separation of the measuring circuit and the power supply circuit is desirable since such separation improves the measuring accuracy in the measuring circuit.

However, there may be a case that because of the restriction on the number of pads 21 in the semiconductor chip 20 or the restriction on the number of bonding fingers 14 in the wiring substrate 10, it is difficult to provide special terminals 14*dt* and 14*st* and pads 21 electrically isolated from the power supply circuit.

Figure 15:
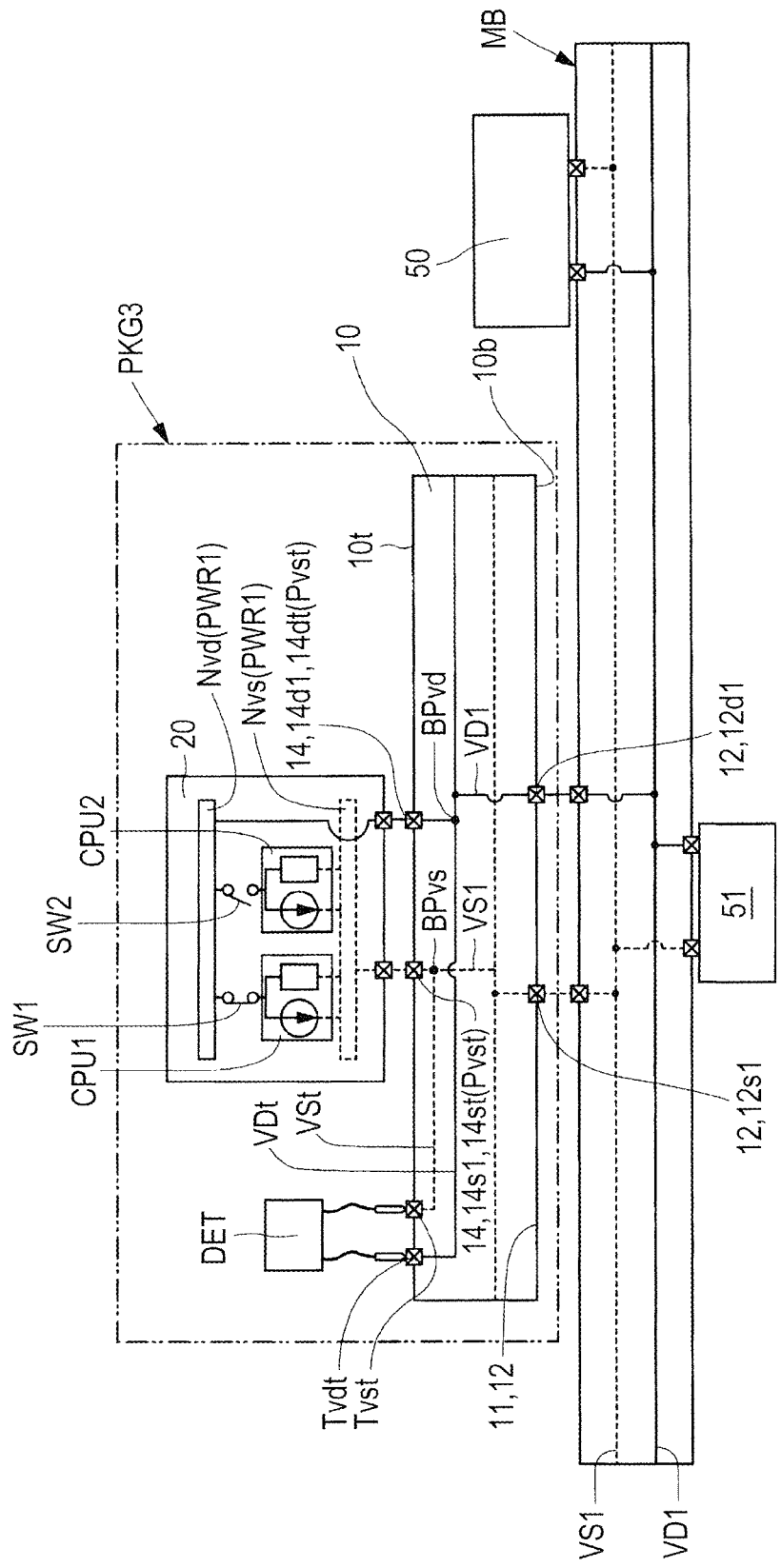
FIG. 15 schematically illustrates the relation between the power supply path to the core circuits and the power measuring path of the core circuits in a semiconductor device as a variation of the semiconductor device shown in FIG. 7.

In such a case, the bonding fingers 14 for power supply may also function as terminals 14*dt* and 14*st* for the measuring circuit as shown in FIG. 15 (Variation 4). FIG. 15 schematically illustrates the relation between the power supply path to the core circuits and the power measuring path of the core circuits in the semiconductor device as a variation of the semiconductor device shown in FIG. 7.

The semiconductor device PKG3 shown in FIG. 15 is different from the semiconductor device PKG1 shown in FIG. 7 in the following points. The terminal 14*dt* connected with the wiring VDt is electrically connected with the power supply line VD1 for supplying a power supply potential to the core circuits (arithmetic processing circuits CPU1 and CPU2) in the wiring substrate 10. The terminal 14*st* connected with the wiring VSt is electrically connected with the reference potential line VS1 for supplying a reference potential to the core circuits in the wiring substrate 10.

Specifically, the terminal 14*dt* connected with the wiring VDt is also used as a power supply potential terminal 14*d*1. The power supply potential wiring path connected with the terminal 14*dt* (power supply potential terminal 14*d*1) is branched into a power supply line VD1 connected with a power supply potential terminal 12*d*1 and a wiring VDt connected with a terminal Tvdt at a branch point BPvd in the wiring substrate 10. Similarly, the terminal 14*st* connected with the wiring VSt is also used as a reference potential terminal 14*s*1. The reference potential wiring path connected with the terminal 14*st* (reference potential terminal 14*s*1) is branched into a reference potential line VS1 connected with a reference potential terminal 12*s*1 and a wiring VSt connected with a terminal Tvst at a branch point BPvs in the wiring substrate 10.

When branching into the power supply wiring path and the power measuring wiring path is made inside the wiring substrate as in this variation, the number of pads 21 in the semiconductor chip 20 (see FIG. 4) and the number of bonding fingers 14 in the wiring substrate 10 can be decreased.

However, when the measuring circuit and the power supply circuit are connected inside the wiring substrate 10, there is concern about the possibility that noise from the power supply circuit may get into the measuring circuit.

Therefore, when the measuring circuit and the power supply circuit are connected inside the wiring substrate 10, it is desirable to adopt the following configuration.

As shown in FIG. 15, the wiring VDt of the semiconductor device PKG3 is electrically isolated from the power supply line VD1 in an area where it does not overlap the semiconductor chip 20. Specifically, the branch point BPvd which connects the wiring VDt and power supply line VD1 of the semiconductor device PKG3 is located at a position where the wiring VDt overlaps the semiconductor chip 20 and the wiring VDt between the branch point BPvd and the terminal Tvdt is not connected with the power supply line VD1.

Also, the wiring VSt of the semiconductor device PKG3 is electrically isolated from the reference potential line VS1 in an area where it does not overlap the semiconductor chip 20. Specifically, the branch point BPvs which connects the wiring VSt and reference potential line VS1 of the semiconductor device PKG3 is located at a position where the wiring VSt overlaps the semiconductor chip 20 and the wiring VSt between the branch point BPvs and the terminal Tvst is not connected with the reference potential line VS1.

If the above configuration is adopted, the influence of noise on the measuring circuit is smaller than when the branch points BPvd and BPvs do not overlap the semiconductor chip 20, or they are located near the terminals Tvdt and Tvst.

<Variation 5>

In the example shown in FIGS. 6 and 7, the terminals Tvdt and Tvst which configure a portion of the measuring circuit are formed on the upper surface 10*t* of the wiring substrate 10. However, it is acceptable that the terminals Tvdt and Tvst be formed on the lower surface 10*b* of the wiring substrate 10 if they can be made to contact the test terminals of the inspection device DET shown in FIG. 7.

This variation is useful if the wiring density of the upper surface 10 is high and it is difficult to provide space for the terminals Tvdt and Tvst. If two or more semiconductor chips are mounted over the upper surface 10*t* of the wiring substrate 10 and the semiconductor chips are electrically connected with each other through the wiring substrate 10, the wiring density of the upper surface 10*t* will be high but the wiring density of the lower surface 10*b* will not be so high, though not shown here.

However, when the terminals Tvdt and Tvst are formed on the lower surface 10*b* as mentioned above, the measuring circuit is configured to include the via wirings 16V and through hole wirings 16T as shown in FIG. 3. Therefore, for the purpose of decreasing the number of impedance discontinuity points in the measuring circuit to improve the measuring accuracy, it is desirable that the terminals Tvdt and Tvst be arranged on the upper surface 10*t* of the wiring substrate 10 as shown in FIGS. 6 and 7.

<Variation 6>

Figure 16:
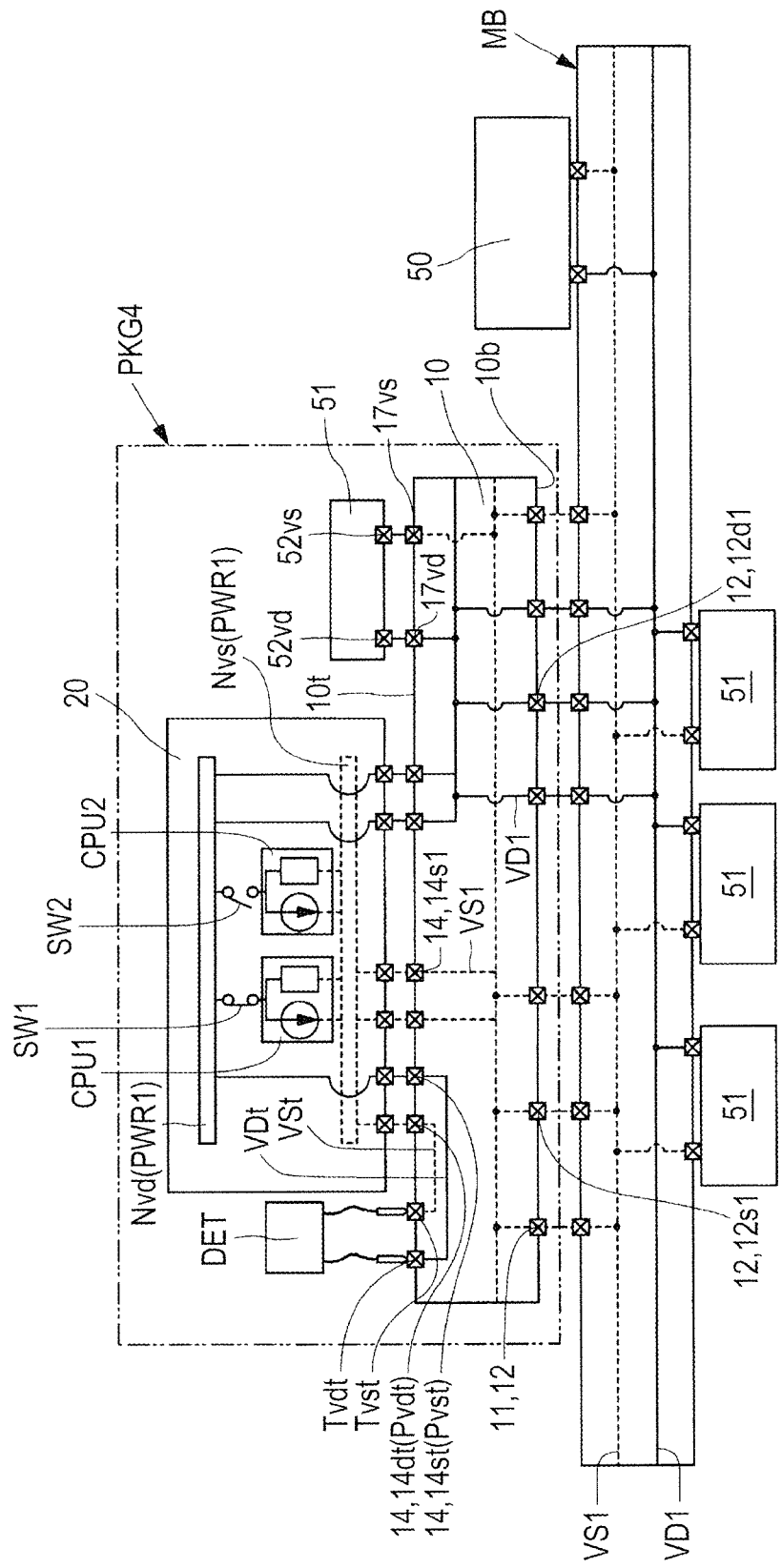
FIG. 16 schematically illustrates the relation between the power supply path to the core circuits and the power measuring path of the core circuits in a semiconductor device as another variation of the semiconductor device shown in FIG. 7.

In the example shown in FIG. 7, the capacitors 51 are mounted on the mounting board MB and no capacitors 51 are mounted on the wiring substrate 10. However, like the semiconductor device PKG4 as shown in FIG. 16, a capacitor 51 may be mounted in the semiconductor device PKG4 (specifically over the wiring substrate 10). FIG. 16 schematically illustrates the relation between the power supply path to the core circuits and the power measuring path of the core circuits in a semiconductor device as another variation of the semiconductor device shown in FIG. 7.

As shown in FIG. 16, the wiring substrate 10 of the semiconductor device PKG4 includes a terminal (capacitor connecting power supply terminal) 17*vd* located on the upper surface 10*t* and connected with the power supply potential terminal 14*d*1 and a terminal (capacitor connecting reference potential terminal) 17*vs* located on the upper surface 10*t* and connected with the reference potential terminal 14*s*1.

A capacitor 51 which includes an electrode 52*vd* electrically connected with the terminal 17*vd* and an electrode 52*vs* electrically connected with the terminal 17*vs* is mounted over the upper surface 10*t* of the wiring substrate 10.

In short, in the capacitor 51, one electrode is connected with the power supply line VD1 and the other end is connected with the reference potential line VS1. In other words, the capacitor 51 is connected in parallel between the power source 50 and the core circuits (arithmetic processing circuits CPU1 and CPU2).

As mentioned above, when the capacitor 51 is located between the power source 50 and the core circuits, the capacitor 51 functions as a battery if the power consumption of the core circuits suddenly increases. The capacitor 51 supplies a current to compensate for current shortage caused by the sudden increase in the electricity demand and suppress the voltage drop in the core circuits.

Also, when the capacitor 51 is located between the power source 50 and the core circuits, it functions as a noise filter which suppresses the transmission of noise components generated between the power source 50 and the capacitor 51 to the core circuits.

As described earlier referring to FIG. 21, when the capacitor 51 mediates between the arithmetic processing circuits CPU1 and CPU2 as the objects of measurement and the measuring circuit, data detected by the inspection device DET is corrected by the capacitor 51.

Therefore, in this variation, preferably the capacitor 51 should not mediate between the core circuits and the measuring circuit.

Accordingly, the wiring VDt which configures the measuring circuit of the semiconductor device PKG4 shown in FIG. 16 is electrically isolated from the terminal 17*vd* (and terminal 17*vs*). Also, the wiring VSt which configures the measuring circuit of the semiconductor device PKG4 shown in FIG. 16 is electrically isolated from the terminal 17*vs* (and terminal 17*vd*). Consequently, even when the capacitor 51 is mounted on the wiring substrate 10, the change in the power consumption of the core circuits can be measured with high accuracy.

As shown in FIG. 16, the wiring VDt is electrically connected with the power supply line VD1 through the power supply potential supply section Nvd as a node in the semiconductor chip 20. Also, the wiring VSt is electrically connected with the reference potential line VS1 through the reference potential supply section Nvs as a node in the semiconductor chip 20. Strictly speaking, in the configuration shown in FIG. 16, the wiring VDt is electrically isolated from the terminal 17*vd* except the path electrically connected with the terminal 17*vd* through the power supply potential supply section Nvd of the semiconductor chip 20 and the power supply line VD1. Also, the wiring VSt is electrically isolated from the terminal 17*vs* except the path electrically connected with the terminal 17*vs* through the reference potential supply section Nvs of the semiconductor chip 20 and the reference potential line VS1.

In this embodiment, the measuring circuit measures the change in the power consumption of the arithmetic processing circuits CPU1 and CPU2 as core circuits. Therefore, the change in power (for example, change in voltage) at the node (power supply circuit PWR1) in the semiconductor chip 20 to supply power to the core circuits may be considered as equivalent to the change in the power consumption of the core circuits. Thus, even when in the power supply circuit PWR1 the measuring circuit and the circuit for power supply (terminals 17*vd* and 17*vs*) are electrically connected, the change in the power consumption of the core circuits can be measured with high accuracy. Consequently, from the viewpoint of measuring the change in the power consumption of the core circuits, the configuration shown in FIG. 16 may be considered as a configuration in which "the wiring VDt is electrically isolated from the terminal 17*vd* and the wiring VSt is electrically isolated from the terminal 17*vs*".

<Variation 7>

In the above embodiment, the inspection device DET is connected with the terminals Tvdt and Tvst as shown in FIG. 7, for example, in order to measure voltage and grasp the change in the power consumption of the core circuits. However, the above technique may be used to measure other various objects.

For example, the technique may be used to measure the power input impedance (frequency axis) of a semiconductor chip or the input impedance estimated from the power source of a semiconductor chip in an electronic device including a mounting board on which a semiconductor device is mounted, as an index which indicates the performance of the semiconductor device.

In this case, the arithmetic processing circuits (or core circuits) in the above embodiment may be replaced by a communication circuit (or input/output circuit).

<Variation 8>

Figure 17:
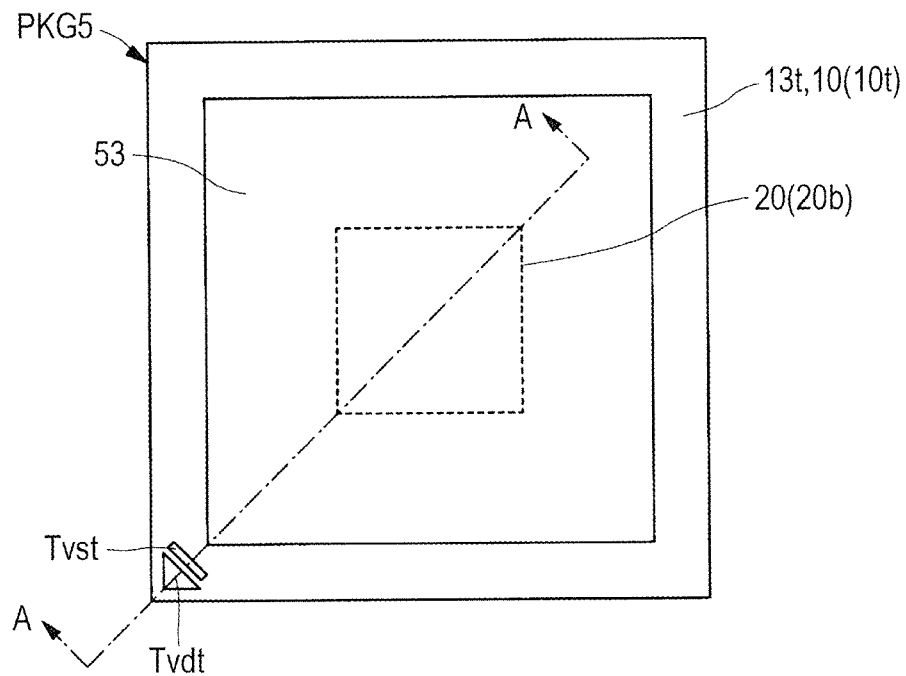
FIG. 17 is a top view of a semiconductor device as a variation of the semiconductor device shown in FIG. 1.
Figure 18:
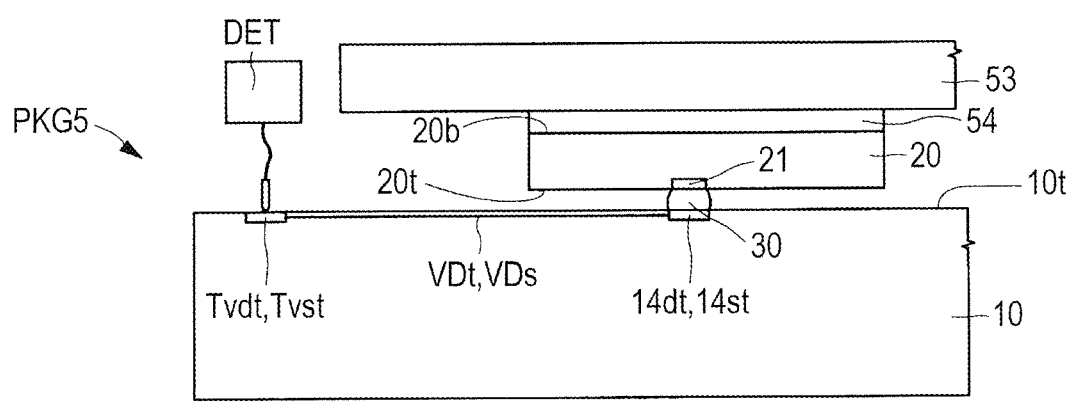
FIG. 18 is a sectional view taken along the line A-A of FIG. 17, showing an essential part of the semiconductor device.

In the above embodiment, as shown in FIGS. 1 and 3, the back surface 20b of the semiconductor chip 20 is not covered by another member. However, the back surface 20b of the semiconductor chip 20 may be covered by another member like the semiconductor device PKG5 shown in FIGS. 17 and 18. FIG. 17 is a top view of a semiconductor device as a variation of the semiconductor device shown in FIG. 1. FIG. 18 is a sectional view taken along the line A-A of FIG. 17, showing an essential part of the semiconductor device PKG5. In FIG. 17, the outline of the back surface 20b of the semiconductor chip 20 is represented by dotted lines in order to indicate the planar positional relation between the semiconductor chip 20 and a member 53. In FIG. 18, hatching is omitted for illustrative simplicity, though the figure is a sectional view. In FIGS. 17 and 18, the underfill resin UF shown in FIG. 1 is omitted.

The semiconductor device PKG5 shown in FIGS. 17 and 18 is different from the semiconductor device PKG1 shown in FIGS. 1 and 3 in that the member 53 is attached to cover the whole back surface of the semiconductor chip 20.

The member 53 shown in FIGS. 17 and 18 is a heat radiating member (heat radiating fin) which radiates the heat accumulated in the semiconductor chip 20 to the outside and is attached to the back surface 20b of the semiconductor chip 20 through an adhesive layer 54. The larger the heat radiating fin area is, the higher the heat radiation efficiency of the semiconductor chip 20 is. In the example shown in FIG. 17, the member 53 covers the whole back surface 20b of the semiconductor chip 20 and in plan view, the area of the member 53 is larger than the area of the back surface 20b of the semiconductor chip 20.

When the back surface 20b of the semiconductor chip 20 is covered by the large member 53 in this way, depending on the positional relation between the member 53 and the terminals Tvdt and Tvst it would be difficult to connect the inspection device DET (see FIG. 18).

For this reason, in this variation, the terminals Tvdt and Tvst are arranged so as not to overlap the member 53 in plan view as shown in FIG. 17. Consequently, the inspection device DET can be easily connected with the terminals Tvdt and Tvst as shown in FIG. 18.

<Variation 9>

Figure 19:
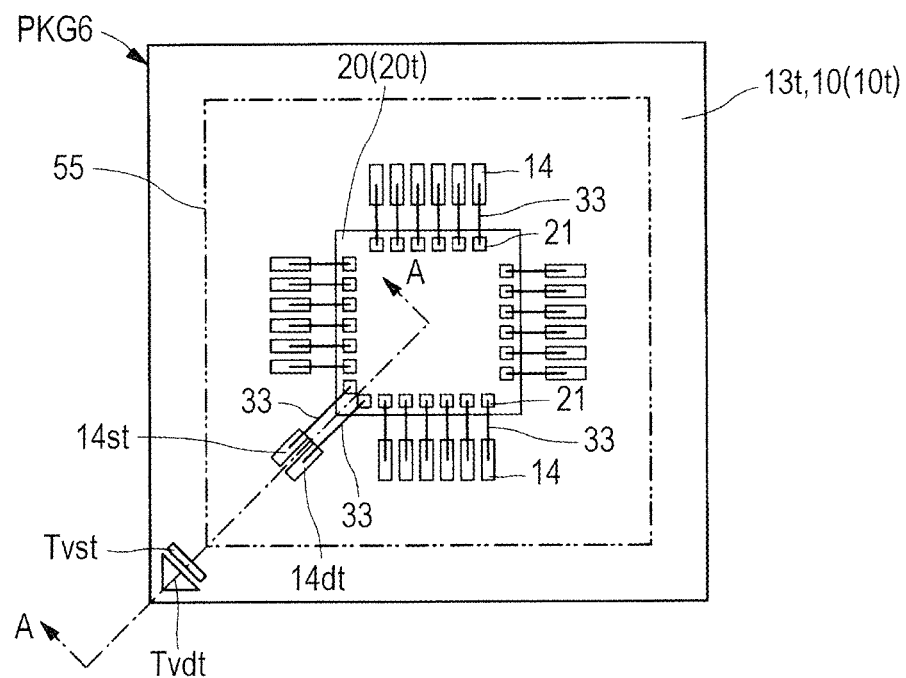
FIG. 19 is a top view of a semiconductor device as another variation of the semiconductor device shown in FIG. 1.
Figure 20:
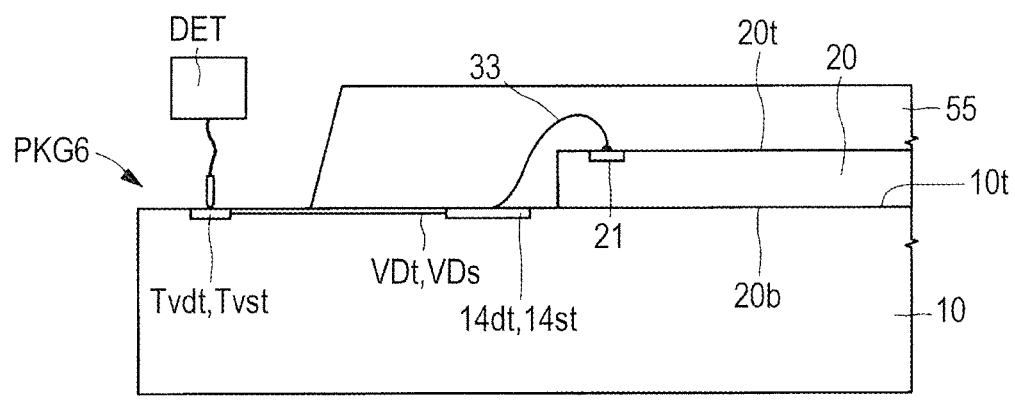
FIG. 20 is a sectional view taken along the line A-A of FIG. 19, showing an essential part of the semiconductor device.

The above embodiment and variations thereof concern semiconductor devices which use the face-down mounting method to mount a semiconductor package over the wiring substrate 10. However, the semiconductor chip 20 and the wiring substrate 10 may be electrically connected through wires (conductive members) 33 like the semiconductor device PKG6 shown in FIGS. 19 and 20. FIG. 19 is a top view of a semiconductor device as a variation of the semiconductor device shown in FIG. 1. FIG. 20 is a sectional view taken along the line A-A of FIG. 19, showing an essential part of the semiconductor device shown in FIG. 19. The semiconductor chip 20 and wires 33 shown in FIG. 19 are sealed with a sealing body (resin body) 55. In FIG. 19, the semiconductor chip 20, bonding fingers (bonding leads) 14, and wires 33 are represented by solid lines in order to show the planar positional relation among them. In FIG. 20, hatching is omitted for illustrative simplicity, though the figure is a sectional view.

The semiconductor device PKG6 shown in FIGS. 19 and 20 is different from the semiconductor device PKG1 shown in FIG. 1 in that the semiconductor chip 20 is mounted over the wiring substrate 10 with the back surface 20b of the semiconductor chip 20 facing to the upper surface 10t of the wiring substrate 10. It is also different from the semiconductor device PKG1 shown in FIG. 1 in that the pads 21 of the semiconductor chip 20 and the bonding fingers 14 of the wiring substrate 10 are electrically connected through the wires 33.

When the semiconductor chip 20 and the wiring substrate 10 are electrically connected through the wires 33 as in the semiconductor device PKG6, the bonding fingers 14 and terminals 14dt and 14st are arranged so as not to overlap the semiconductor chip 20. However, in order to protect the wires 33, the bonding fingers 14 including joints with the wires 33 are covered by the sealing body 55.

Therefore, in this variation, as shown in FIG. 19, the terminals Tvdt and Tvst are arranged so as not to overlap the sealing body 55 in plan view. Consequently, the inspection device DET can be easily connected with the terminals Tvdt and Tvst as shown in FIG. 20.

<Variation 10>

Various variations have been described so far. A combination of these variations may be adopted.

Some details of the embodiment described above are given below.

[Note 1]

A semiconductor device which includes:

a semiconductor chip including a first main surface, a plurality of electrodes arranged on the first main surface, a first arithmetic processing circuit electrically connected with one or more of the electrodes, a second arithmetic processing circuit electrically connected with other ones of the electrodes, a power supply potential supply section for supplying a power supply potential to the first arithmetic processing circuit and the second arithmetic processing circuit, and a reference potential supply section for supplying a reference potential to the first arithmetic processing circuit and the second arithmetic processing circuit;

a wiring substrate including a first surface over which the semiconductor chip is mounted, a plurality of first terminals arranged on the first surface, a second surface opposite to the first surface, a plurality of second terminals arranged on the second surface, a plurality of wirings electrically connecting the first terminals with the second terminals, a third terminal arranged on the first surface and electrically connected with the power supply potential supply section of the semiconductor chip, a fourth terminal electrically connected with the third terminal, a first wiring electrically connecting the third terminal with the fourth terminal, a fifth terminal arranged on the first surface and electrically connected with the reference potential supply section of the semiconductor chip, a sixth terminal electrically connected with the fifth terminal, and a second wiring electrically connecting the fifth terminal with the sixth terminal; and a plurality of conductive members connecting the first terminals, the third terminal, and the fifth terminal with the electrodes, wherein the second arithmetic processing circuit is coupled with one or both of the power supply potential supply section and the reference potential supply section through a second switch, wherein the fourth terminal is arranged closer to a periphery of the wiring substrate than the third terminal, wherein the sixth terminal is arranged closer to the periphery of the wiring substrate than the fifth terminal, and wherein the second wiring is extended along the first wiring.

What is claimed is:

1. A semiconductor device comprising:
a semiconductor chip including a first main surface, a plurality of electrodes arranged on the first main surface, a first circuit electrically connected with one or more of the electrodes, a power supply potential supply section for supplying a power supply potential to the first circuit, and a reference potential supply section for supplying a reference potential to the first circuit;
a wiring substrate including a first surface over which the semiconductor chip is mounted, a plurality of first terminals arranged on the first surface, a second surface opposite to the first surface, a plurality of second terminals arranged on the second surface, a plurality of wirings electrically connecting the first terminals with the second terminals, a third terminal arranged on the first surface and electrically connected with the power supply potential supply section of the semiconductor chip, a fourth terminal electrically connected with the third terminal, a first wiring electrically connecting the third terminal with the fourth terminal, a fifth terminal arranged on the first surface and electrically connected with the reference potential supply section of the semiconductor chip, a sixth terminal electrically connected with the fifth terminal, and a second wiring electrically connecting the fifth terminal with the sixth terminal; and
a plurality of conductive members connecting the plurality of first terminals, the third terminal and the fifth terminal with the plurality of electrodes, respectively,
wherein the fourth terminal is arranged closer to a periphery of the wiring substrate than the third terminal,
wherein the sixth terminal is arranged closer to the periphery of the wiring substrate than the fifth terminal, and
wherein the second wiring is extended along the first wiring.

2. The semiconductor device according to claim 1,
the first terminals of the wiring substrate comprising:
a first power supply potential terminal for supplying the power supply potential to the power supply potential supply section of the semiconductor chip; and
a first reference potential terminal for supplying the reference potential to the reference potential supply section of the semiconductor chip, and
the plurality of second terminals of the wiring substrate comprising:
a second power supply potential terminal electrically connected with the first power supply potential terminal through a first power supply potential wiring path; and
a second reference potential terminal electrically connected with the first reference potential terminal through a first reference potential wiring path,
wherein a width of the first wiring and a width of the second wiring are smaller than a width of a reference potential via wiring which configures a portion of the first reference potential wiring path.

3. The semiconductor device according to claim 1,
the first terminals of the wiring substrate comprising:
a first power supply potential terminal for supplying the power supply potential to the power supply potential supply section of the semiconductor chip; and
a first reference potential terminal for supplying the reference potential to the reference potential supply section of the semiconductor chip, and
the plurality of second terminals of the wiring substrate comprising:
a second power supply potential terminal electrically connected with the first power supply potential terminal through a first power supply potential wiring path; and
a second reference potential terminal electrically connected with the first reference potential terminal through a first reference potential wiring path,
wherein the first wiring is electrically isolated from the first power supply potential wiring path, and
wherein the second wiring is electrically isolated from the first reference potential wiring path.

4. The semiconductor device according to claim 2,
wherein the plurality of first terminals, the third terminal, and the fifth terminal are arranged so as to overlap the semiconductor chip, and
wherein the fourth terminal and the sixth terminal are arranged so as not to overlap the semiconductor chip.

5. The semiconductor device according to claim 4,
wherein the first main surface of the semiconductor chip has a first side, a second side intersecting with the first side, and a first corner as an intersection between the first side and the second side, and
wherein the plurality of electrodes of the semiconductor chip include a plurality of peripheral electrodes arranged along a periphery of the first main surface and a plurality of center electrodes located more inward than the plurality of peripheral electrodes,
the peripheral electrodes comprising:
a first electrode nearest to the first corner among the electrodes arranged along the first side of the first main surface; and
a second electrode nearest to the first corner among the electrodes arranged along the second side of the first main surface,
wherein the third terminal and the fifth terminal are connected with one or more of the plurality of center electrodes, and
wherein the first wiring and the second wiring partially overlap an area between the first electrode and the second electrode of the semiconductor chip in plan view.

6. The semiconductor device according to claim 4,
wherein the second power supply potential terminal and the second reference potential terminal are arranged so as to overlap the semiconductor chip.

7. The semiconductor device according to claim 4,
wherein the first wiring is electrically isolated from the first power supply potential wiring path in an area which does not overlap the semiconductor chip, and
wherein the second wiring is electrically isolated from the first reference potential wiring path in an area which does not overlap the semiconductor chip.

8. The semiconductor device according to claim 4,
wherein the semiconductor chip comprises a second main surface opposite to the first main surface,
wherein a first member is attached so as to cover the whole second main surface, and
wherein the fourth terminal and the sixth terminal are arranged so as not to overlap the first member in plan view.

9. The semiconductor device according to claim 2, wherein the fourth terminal and the sixth terminal are arranged on the first surface of the wiring substrate and electrically isolated from the plurality of second terminals.

10. The semiconductor device according to claim 2, the wiring substrate comprising:
a seventh terminal arranged on the first surface of the wiring substrate and connected with the first power supply potential terminal; and
an eighth terminal arranged on the first surface of the wiring substrate and connected with the first reference potential terminal,
wherein a first capacitor component including a third electrode electrically connected with the seventh terminal and a fourth electrode electrically connected with the eighth terminal is mounted over the first surface of the wiring substrate,
wherein the first wiring is electrically isolated from the seventh terminal, and
wherein the second wiring is electrically isolated from the eighth terminal.

11. The semiconductor device according to claim 1,
wherein the semiconductor chip comprises a second circuit which operates independently of the first circuit, and
wherein the first circuit and the second circuit are arithmetic processing circuits which are supplied with the power supply potential from the power supply potential supply section and supplied with the reference potential from the reference potential supply section.

12. The semiconductor device according to claim 1,
wherein the plurality of wirings of the wiring substrate include a first signal wiring to which an electric signal is transmitted, and
wherein a width of the first wiring and a width of the second wiring are not larger than a width of the first signal wiring.

13. The semiconductor device according to claim 1, wherein the fourth terminal and the sixth terminal are arranged on the first surface of the wiring substrate.

14. The semiconductor device according to claim 13, wherein the first wiring and the second wiring are formed in a wiring layer.

15. The semiconductor device according to claim 13,
wherein the first wiring is formed in a first wiring layer among a plurality of wiring layers of the wiring substrate, and
wherein the second wiring is formed in a second wiring layer stacked adjacent to the first wiring layer.

16. The semiconductor device according to claim 1,
wherein the first surface of the wiring substrate is covered by a first insulating film,
wherein the fourth terminal or the sixth terminal is exposed from the first insulating film in a first opening made in the first insulating film, and
wherein an exposed area of the fourth terminal or the sixth terminal is the largest among exposed areas of conductive patterns exposed from the first insulating film on the first surface of the wiring substrate.

17. The semiconductor device according to claim 1, wherein a width of the first wiring is equal to a width of the second wiring.

18. The semiconductor device according to claim 1,
wherein the semiconductor chip comprises a second circuit different from the first circuit,
wherein the first circuit and the second circuit are arithmetic processing circuits which are supplied with the power supply potential from the power supply potential supply section and supplied with the reference potential from the reference potential supply section, and
wherein the second circuit is connected with one or both of the power supply potential supply section and the reference potential supply section through a switch.

* * * * *